(12) United States Patent
Sugawara et al.

(10) Patent No.: US 8,975,956 B2
(45) Date of Patent: Mar. 10, 2015

(54) DIGITAL AMPLIFIER

(75) Inventors: Hiroshi Sugawara, Fukuoka (JP);
Hisayuki Sasaki, Fukuoka (JP); Shigeki Niwayama, Shizuoka (JP); Yoshiki Maeda, Shizuoka (JP); Toshimi Takano, Shizuoka (JP)

(73) Assignees: Panasonic Corporation, Osaka (JP);
Roland Corporation, Shizuoka (JP)

( * ) Notice: Subject to any disclaimer, the term of this patent is extended or adjusted under 35 U.S.C. 154(b) by 0 days.

(21) Appl. No.: 13/583,447

(22) PCT Filed: Feb. 7, 2011

(86) PCT No.: PCT/JP2011/000670
§ 371 (c)(1),
(2), (4) Date: Sep. 7, 2012

(87) PCT Pub. No.: WO2011/111298
PCT Pub. Date: Sep. 15, 2011

(65) Prior Publication Data
US 2013/0021096 A1 Jan. 24, 2013

(30) Foreign Application Priority Data
Mar. 11, 2010 (JP) ................................. 2010-054643

(51) Int. Cl.
*H03F 3/38* (2006.01)
*H03F 3/217* (2006.01)

(52) U.S. Cl.
CPC ..................................... *H03F 3/217* (2013.01)
USPC .......................................... 330/10; 330/251

(58) Field of Classification Search
CPC ..... H03F 3/217; H03F 3/2173; H03F 3/2171; H03F 2200/351; H03F 2200/331; H03F 2200/03; H03F 2200/78; H03F 3/185; H03K 3/57

USPC ......................................... 330/10, 207 A, 251
See application file for complete search history.

(56) References Cited

U.S. PATENT DOCUMENTS 7,825,726 B2 * 11/2010 Midya et al. ..................... 330/10
8,330,538 B2 * 12/2012 Chen et al. ....................... 330/10
(Continued)

FOREIGN PATENT DOCUMENTS

JP  9-148851     6/1997
JP  2004-72707   3/2004
(Continued)

OTHER PUBLICATIONS

Chinese Office Action, mail date is Oct. 20, 2014.

*Primary Examiner* — Khanh V Nguyen
(74) *Attorney, Agent, or Firm* — Greenblum & Bernstein P.L.C.

(57) ABSTRACT

A digital amplifier comprises: a switching unit that amplifies a signal input to the digital amplifier by performing a switching operation; a driving unit that turns the switching unit on and off; an input signal detection unit that detects an input signal to the digital amplifier; and a first control unit that performs control such that the switching unit starts a switching operation by starting driving of the driving unit, when the digital amplifier is changed to a signal input state and the input signal detection unit detects an input signal, and performs control such that the switching unit stops the switching operation by stopping the driving of the driving unit, when the digital amplifier is changed to a no signal input state and the input signal detection unit does not detect an input signal. This configuration enables to reduce power consumption when no signal is input.

4 Claims, 34 Drawing Sheets

(56) References Cited

U.S. PATENT DOCUMENTS

| | | |
|---|---|---|
| 2004/0041626 A1 | 3/2004 | Yokoyama |
| 2004/0066229 A1 | 4/2004 | Taura et al. |
| 2005/0225384 A1 | 10/2005 | Taura et al. |
| 2005/0231281 A1 | 10/2005 | Taura et al. |
| 2006/0197570 A1 | 9/2006 | Yang et al. |
| 2007/0279101 A1 | 12/2007 | Onodera et al. |
| 2008/0284508 A1* | 11/2008 | Walker et al. .................... 330/10 |
| 2013/0089223 A1* | 4/2013 | Heineman et al. ............ 381/120 |

FOREIGN PATENT DOCUMENTS

| | | |
|---|---|---|
| JP | 2004-88578 | 3/2004 |
| JP | 2004-266398 | 9/2004 |
| JP | 2005-341327 | 12/2005 |
| JP | 2005-348288 | 12/2005 |
| JP | 2007-88926 | 4/2007 |
| JP | 2009-33430 | 2/2009 |
| JP | 2009-89301 | 4/2009 |
| JP | 2009-135717 | 6/2009 |
| WO | 2005/104349 | 11/2005 |

* cited by examiner

DIGITAL AMPLIFIER

TECHNICAL FIELD

The present invention relates to a digital amplifier which does not perform a switching operation when no signal is input.

BACKGROUND ART

As shown in FIG. 29, in a switching amplifier shown in FIG. 7 of PTL 1, a response peak occurs at a high frequency around the cutoff frequency of a low-pass filter at the time of a high impedance load or no load. In order to suppress this, as shown in FIG. 30, providing a damper formed by a capacitor CD and a resistor RD in parallel to a low-pass filter capacitor C may be considered.

In addition, in a case where a MOSFET is used as switching elements FET1 and FET2, reverse recovery where a turned-on state transitions to a turned-off state is not instantly performed due to an embedded diode (body diode) of the MOSFET. As a result, a reverse current flows through the embedded diode due to the carrier accumulation effect even if the switching element body is turned off, and thereby a through current flows from a turned-on switching element to a turned-off switching element. In order to prevent the through current, it is considered that, as shown in FIG. 31, high-speed diodes D3 and D4 for preventing back-flow are provided in series to a switching element, and high-speed diodes D5 and D6 for bypass of a counter electromotive force are provided in parallel to the switching element.

However, power loss occurs in the above-described damper, and thus power loss also occurs in the high-speed diodes D3 and D4 for preventing back-flow. As a result, there is a problem in that efficiency is lowered. In order to solve the problem, a digital power amplifier shown in FIG. 1 of PTL 1 has a configuration shown in FIG. 32.

In the digital power amplifier, as a feedback circuit from a connection point between a coil L and a capacitor C forming a low-pass filter to an analog amplifier OP, a serial circuit of a capacitor Cf and a resistor R2f is configured. By applying the serial circuit as a feedback circuit, a damping effect is increased by a multiple of a loop gain, and thus high resistance can be used for a damping resistor. For example, a resistor of several tens of kΩ is applied as the resistor R2f, and a capacitor of 100 pF is applied as the capacitor Cf. As such, the serial circuit also has the function of the damper (the capacitor CD and the resistor RD) shown in FIG. 30. In addition, by applying the serial circuit as a feedback circuit, a phase delay of the high frequency around the cutoff frequency of the low-pass filter is suppressed to 90 degrees, and thus a phase delay which reaches at a maximum of 180 degrees in the low-pass filter is suppressed to 90 degrees, thereby suppressing oscillation. With this serial circuit, power loss can be considerably reduced as compared with the circuit in FIG. 30.

In addition, in a digital amplifier block 10 of the digital power amplifier, as shown in FIG. 33, a switching element SW1, a coil L11, a coil L12, and a switching element SW2 are connected in this order between the positive and negative power supply lines +B and −B. In addition, the connection point between the switching element SW1 and the coil L11 is connected to a cathode of a high-speed diode D12, and an anode of the high-speed diode D12 is connected to the negative power supply line −B. In addition, the connection point between the coil L12 and the switching element SW2 is connected to an anode of a high speed diode D11, and a cathode of the high-speed diode D11 is connected to the positive power supply line +B. In addition, the connection point between the coils L11 and L12 is connected to one end of a low-pass filter coil L.

As shown in FIG. 33, in a state where only the switching element SW1 is turned on, a power supply current I11 flows, and thus energy is accumulated in the coil L11 as well as the low-pass filter coil L. Here, if the switching element SW1 is turned off (the turned-off state of the switching element SW2 is maintained) through dead time control when a switching element in a turned-on state is turned off, a current I12 shown in FIG. 34 flows due to counter electromotive forces of the low-pass filter coil L and the coil L11. In other words, the coil L11 makes a current flow due to the counter electromotive force thereof and thus draws a current caused by the counter electromotive force of the low-pass filter coil L into the coil L11. As such, the coil L11 prevents the current caused by the counter electromotive force of the low-pass filter coil L from flowing through the switching element SW2 side (an embedded diode side of the switching element SW2). That is to say, the coil L11 shows a back-flow preventing function in the same manner as the back-flow preventing diode D4 shown in FIG. 29.

As such, the coil L11 shows a back-flow preventing function in the same manner as the back-flow preventing diode D4 shown in FIG. 29. As described above, power loss occurs in the back-flow preventing diode D4 but power loss does not occur in the coil L11.

CITATION LIST

Patent Literature

[PTL 1] JP-A-2004-88578

SUMMARY OF INVENTION

Technical Problem

According to the above-described digital power amplifier disclosed in PTL 1, power loss in a circuit operation when a signal is input is improved. However, the digital power amplifier performs a switching operation even when the load (speaker) is not required to be driven since a signal is not input. In other words, when no signal is input, wasted power loss due to the switching operation occurs.

An object of the present invention is to provide a digital amplifier capable of reducing power consumption when no signal is input.

Solution to Problem

According to one aspect of the present invention, there is provided a digital amplifier which amplifies a signal, comprising:

a switching unit that amplifies a signal input to the digital amplifier by performing a switching operation;

a driving unit that turns the switching unit on and off;

an input signal detection unit that detects whether or not there is an input signal to the digital amplifier; and a first control unit that performs control such that the switching unit starts a switching operation by starting driving of the driving unit, when the digital amplifier is changed from a no signal input state to a signal input state and the input signal detection unit detects an input signal to the digital amplifier, and performs control such that the switching unit stops the switching operation by stopping the driving of the driving unit, when the digital amplifier is changed from a signal input state to a no signal input state and the input signal detection unit does not detect an input signal to the digital amplifier.

According to this configuration, it is possible to reduce power consumption when no signal is input.

The digital amplifier according to this invention may further comprise:

a delay unit that delays an input signal to the digital amplifier by a predetermined time so as to be transmitted to the switching unit, wherein the switching unit amplifies the input signal to the digital amplifier which is sent via the delay unit.

According to this configuration, sound lack does not occur when the switching unit starts the switching operation.

The digital amplifier according to this invention may further comprise:

a switch unit that opens and closes a path where an amplified signal output from the switching unit is output from the digital amplifier, wherein the first control unit controls the switch unit so as to close the path, when the digital amplifier is changed from a no signal input state to a signal input state, and the input signal detection unit detects an input signal to the digital amplifier, and controls the switch unit so as to open the path, when the digital amplifier is changed from a signal input state to a no signal input state, and the input signal detection unit does not detect an input signal to the digital amplifier.

According to this configuration, since opening and closing of the switch unit are controlled such that the switch unit enters an open state at the time when pop noise may occur, pop noise is not output.

The digital amplifier according to this invention may further comprise:

a switch unit that opens and closes a path where an amplified signal output from the switching unit is output from the digital amplifier; and a logical operation unit that outputs a logical sum signal where an output signal of the delay unit is convoluted on an input signal to the digital amplifier, wherein the input signal detection unit detects presence and absence of the logical sum signal output from the logical operation unit, and wherein the first control unit performs control such that the switching unit starts a switching operation by starting driving of the driving unit and controls the switch unit so as to close the path, when the digital amplifier is changed from a no signal input state to a signal input state and the input signal detection unit detects the logical sum signal, and performs control such that the switching unit stops the switching operation by stopping the driving of the driving unit and controls the switch unit so as to open the path, when the digital amplifier is changed from a signal input state to a no signal input state and the input signal detection unit does not detect the logical sum signal.

According to this configuration, even in a no signal input state, the switch unit does not enter an open state until at least the delay time has elapsed from a state where the input signal to the digital amplifier does not exist, and thus sound lack does not occur.

In the digital amplifier according to this invention, timing when the path is closed based on the control of the first control unit is within a delay time of a signal by the delay unit and is later than timing when the switching unit starts a switching operation based on the control of the first control unit, and wherein timing when the path is opened based on the control of the first control unit is earlier than timing when the switching unit stops the switching operation based on the control of the first control unit.

In the digital amplifier according to this invention, the switching operation is an operation where two switching elements connected in series included in the switching unit are alternately turned on and off, wherein the digital amplifier further includes a dead time control unit that controls the driving unit such that both of the two switching elements are turned off when the switching unit performs a switching operation; and a dead time setting unit that sets time when both of the two switching elements are turned off by the dead time control unit, and wherein the dead time setting unit sets time when both of the two switching elements are turned off, to be longer than a typical time for a predetermined time, when the digital amplifier is changed from a no signal input state to a signal input state and the input signal detection unit detects an input signal to the digital amplifier.

According to this configuration, it is possible to reduce pop noise when the switching unit performs a switching operation.

The digital amplifier according to this invention may further comprise:

a delay unit that delays an input signal to the digital amplifier by a predetermined time so as to be transmitted to the switching unit, wherein the switching unit amplifies the input signal to the digital amplifier which is sent via the delay unit.

According to this configuration, sound lack does not occur when the switching unit starts the switching operation.

The digital amplifier according to this invention may further comprise:

an input signal correction unit that corrects an input signal to the digital amplifier; and a second control unit, wherein the second control unit controls the input signal correction unit such that a signal having a reverse phase to an input signal is applied to the input signal to the digital amplifier for a predetermined time when the input signal detection unit detects the input signal to the digital amplifier.

According to this configuration, it is possible to reduce pop noise when the switching unit performs a switching operation.

The digital amplifier according to this invention may further comprise:

a modulation unit that is driven with a reference potential different from a reference potential of the switching unit and performs pulse modulation for an input signal to the digital amplifier;

an output voltage detection unit that detects an output voltage of the switching unit;

an initial voltage adjustment unit that adjusts an output voltage of the modulation unit according to a detection result of the output voltage detection unit; and a fifth control unit, wherein the fifth control unit controls the initial voltage adjustment unit so as to apply a predetermined bias voltage to the modulation unit when the input signal detection unit detects an input signal to the digital amplifier.

According to this configuration, it is possible to reduce pop noise when the switching unit performs a switching operation.

The digital amplifier according to this invention may further comprise:

a signal detection unit that detects that power of an amplified signal output from the switching unit is 0, wherein the first control unit stops the driving of the driving unit such that the switching operation is stopped according to a result detected by the signal detection unit when performing control so as to stop the switching operation of the switching unit.

According to this configuration, it is possible to reduce pop noise when the switching unit stops the switching operation.

The digital amplifier according to this invention may further comprise:

a first gain correction unit that performs correction for increasing a gain of the switching unit; and a third control unit that performs control such that the first gain correction unit is driven when the digital amplifier is changed from a no signal input state to a signal input state and the input signal detection unit detects an input signal to the digital amplifier.

According to this configuration, it is possible to compensate for reduction in the reproducibility of the signal immediately after the switching operation starts.

The digital amplifier according to this invention may further comprise:

a power supply voltage detection unit that detects a power supply voltage supplied to the switching unit, wherein the first gain correction unit corrects a gain of the switching unit according to a power supply voltage detected by the power supply voltage detection unit.

According to this configuration, it is possible to correct waveforms according to a variation in the power supply voltage, the gain correction can be performed with higher accuracy.

The digital amplifier according to this invention may further comprise:

a modulation unit that performs pulse modulation for an input signal to the digital amplifier;

a feedback unit that feeds back an output signal of the switching unit to the modulation unit; and a feedback amount changing unit that changes a feedback amount of the feedback unit.

According to this configuration, it is possible to compensate for reduction in the reproducibility of the signal immediately after the switching operation starts.

The digital amplifier according to this invention may further comprise:

a plurality of kinds of modulation units that perform pulse modulation for an input signal to the digital amplifier and are provided in parallel to the input signal;

a feedback unit that feeds back an output signal of the switching unit to at least one of the plurality of kinds of modulation units;

an output changing unit that outputs at least one of output signals of the plurality of kinds of modulation units to the driving unit; and a fourth control unit that controls the output changing unit so as to output at least one of output signals of the plurality of kinds of modulation units when the digital amplifier is changed from a no signal input state to a signal input state and the input signal detection unit detects an input signal to the digital amplifier.

According to this configuration, it is possible to compensate for reduction in the reproducibility of the signal immediately after the switching operation starts.

In the digital amplifier according to this invention, the plurality of kinds of modulation units include a first modulation unit that performs pulse modulation for an input signal to the digital amplifier in response to a feedback signal from the feedback unit; and a second modulation unit that performs the pulse modulation for the input signal to the digital amplifier without using the feedback signal from the feedback unit, wherein the fourth control unit controls the output changing unit so as to output an output signal of the second modulation unit when the digital amplifier is changed from a no signal input state to a signal input state and the input signal detection unit detects an input signal to the digital amplifier.

According to this configuration, it is possible to compensate for reduction in the reproducibility of the signal immediately after the switching operation starts.

In the digital amplifier according to this invention, the plurality of kinds of modulation units include a high-order modulation unit that performs pulse modulation for an input signal to the digital amplifier in response to a feedback signal from the feedback unit; and a low-order modulation unit that performs the pulse modulation for the input signal to the digital amplifier in response to the feedback signal from the feedback unit, wherein the fourth control unit controls the output changing unit so as to output an output signal of the low-order modulation unit when the digital amplifier is changed from a no signal input state to a signal input state and the input signal detection unit detects an input signal to the digital amplifier.

According to this configuration, it is possible to compensate for reduction in the reproducibility of the signal immediately after the switching operation starts.

Advantageous Effects of Invention

According to the digital amplifier of the present invention, it is possible to reduce power consumption when no signal is input.

DESCRIPTION OF EMBODIMENTS

Hereinafter, embodiments of the present invention will be described with reference to the drawings.

First Embodiment

Figure 1:
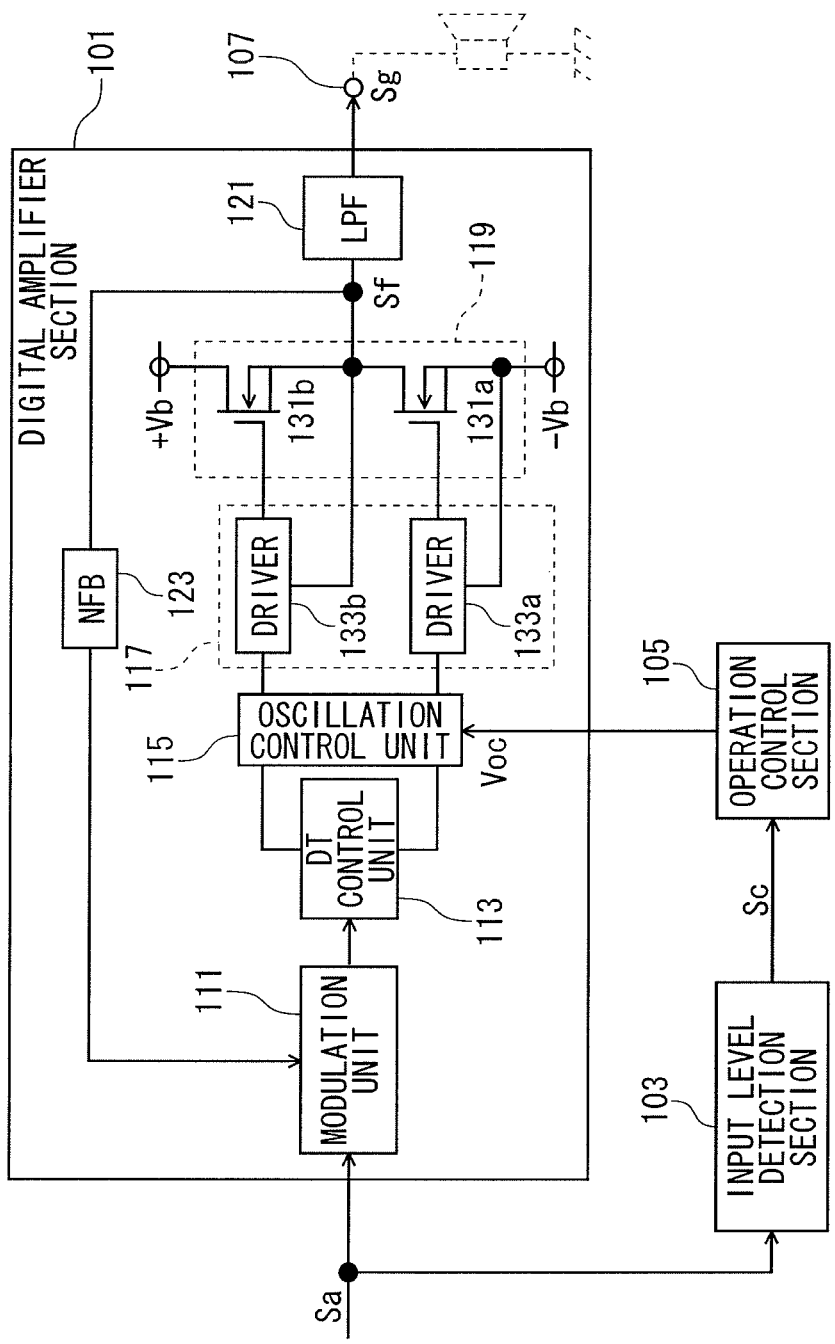
FIG. 1 is a block diagram illustrating a configuration of an output stage of a digital amplifier according to a first embodiment.

FIG. 1 is a block diagram illustrating a configuration of an output stage of a digital amplifier according to the first embodiment. As shown in FIG. 1, the digital amplifier according to the first embodiment includes a digital amplifier section 101, an input level detection section 103, and an operation control section 105. In addition, an output end 107 provided at the rear stage of the digital amplifier section 101 is connected to a load such as a speaker.

The digital amplifier section 101 amplifies an input signal. A signal input to the digital amplifier section 101 is, for example, an audio signal, and a form thereof may be analog or digital. As shown in FIG. 1, the digital amplifier section 101 includes a modulation unit 111, a dead time control unit (DT control unit) 113, an oscillation control unit 115, a driving unit 117, a switching unit 119, an LPF (Low-Pass Filter) 121, and an NFB (Negative FeedBack) 123.

Hereinafter, each constituent element of the digital amplifier section 101 will be described. The modulation unit 111 is, for example, a PWM (Pulse Width Modulation) circuit, and converts a signal input to the digital amplifier section 101 into a digital pulse signal. The modulation unit 111 outputs a digital pulse signal corrected in response to a feedback signal from the NFB 123.

The switching unit 119 has switching elements 131a and 131b which are connected in series in two upper and lower stages and amplifies a signal through switching. The switching elements 131a and 131b are power transistors, MOSFETs or IGBTs. The driving unit 117 has drivers 133a and 133b configured in two upper and lower stages. The driver 133a drives the switching element 131a so as to be switched, and the driver 133b drives the switching element 131b so as to be switched.

The drivers of the driving unit 117 respectively drive the switching elements such that the switching elements 131a and 131b are ideally operated in a logical manner reverse to each other. However, if On and Off states of an actual transistor are to be changed, turning-on time or turning-off time exists. For this reason, both of the switching elements 131a and 131b are turned on, and thus a short circuit is generated between the upper and lower stages. In order to prevent this situation, time when both the switching elements are turned off, that is, "dead time" may be set at timing when one of the switching elements is changed from a turned-off state to a turned-on state.

The dead time control unit (DT control unit) 113 controls the driving unit 117 such that the dead time is provided when the switching unit 119 performs switching. In addition, if the dead time is long, a duty ratio of a signal input to each of the switching elements 131a and 131b is small, and thus it is not necessary to provide a separate duty ratio adjustment circuit. The oscillation control unit 115 can select starting and stopping of oscillation. Specifically, whether or not a digital pulse signal applied from the dead time control unit 113 is transmitted to the drivers is selected. The oscillation control unit 115 performs an oscillation operation in response to a potential of an output signal of the operation control section 105, thereby opening and closing the path.

The LPF 121 is demodulation means formed by an LC circuit. The LPF 121 filters high and middle frequency bands, and thereby a digital pulse signal amplified by the switching unit 119 is demodulated. The demodulated signal is output from the output end 107. The NFB 123 is a negative feedback amplification circuit, and feeds back an output signal of the switching unit 119 to the modulation unit 111.

The input level detection section 103 detects whether or not there is an input signal by detecting a level of the input signal. The input level detection section 103 outputs a signal obtained by performing full-wave rectification for the input signal. In addition, as described above, the input signal is, for example, an audio signal, and a form thereof may be analog or digital. Further, the input level detection section 103 may perform half-wave rectification, AC-DC conversion, sample and hold, or AC level detection, instead of the full-wave rectification.

The operation control section 105 controls an oscillation operation of the oscillation control unit 115 of the digital amplifier section 101 in response to a signal input from the input level detection section 103. By the control, starting or stopping of the switching operation performed by the switching unit 119 is controlled. Further, a level of an input signal for starting or stopping the switching operation is actually equal to or more than remaining noise of the digital amplifier of the present embodiment and is about −60 dBm to −40 dBm.

Figure 2:
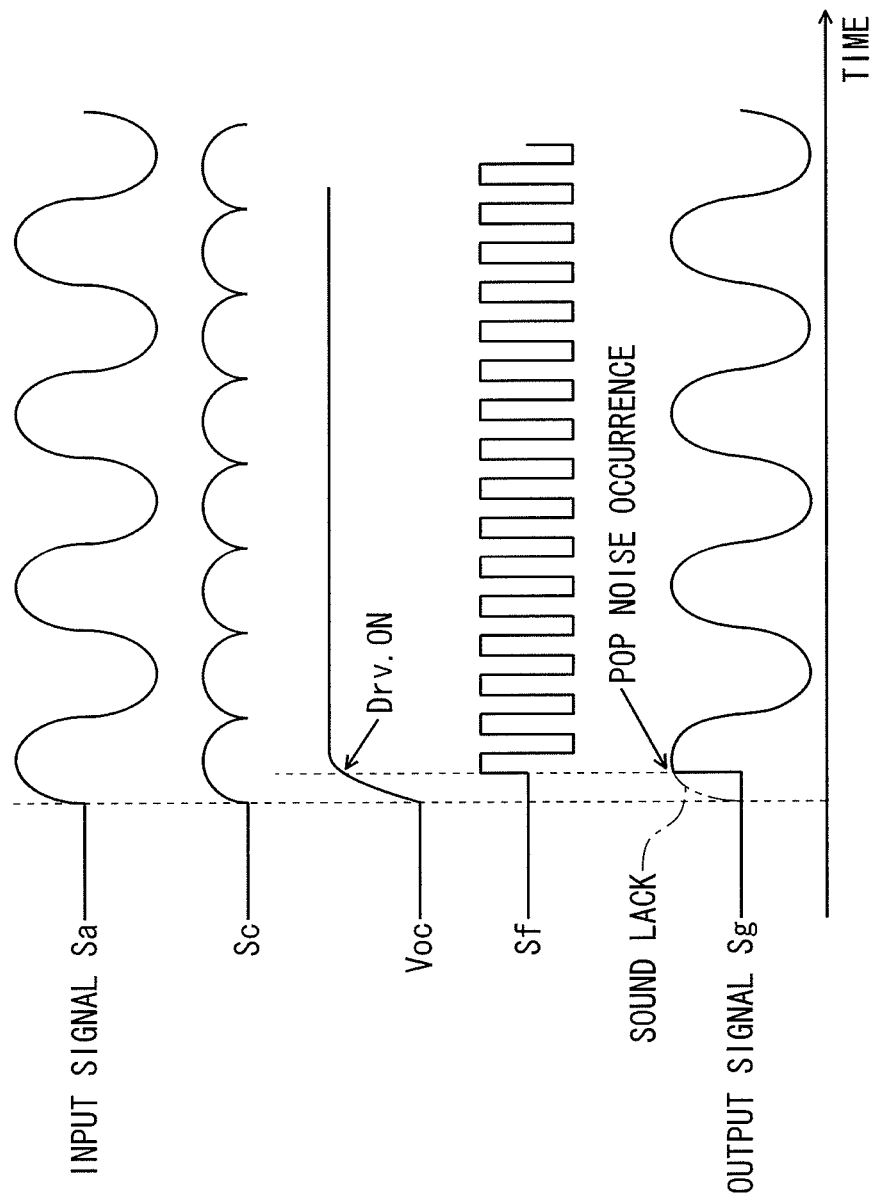
FIG. 2 is a diagram illustrating signal waveforms when a switching operation is started in the digital amplifier according to the first embodiment.
Figure 3:
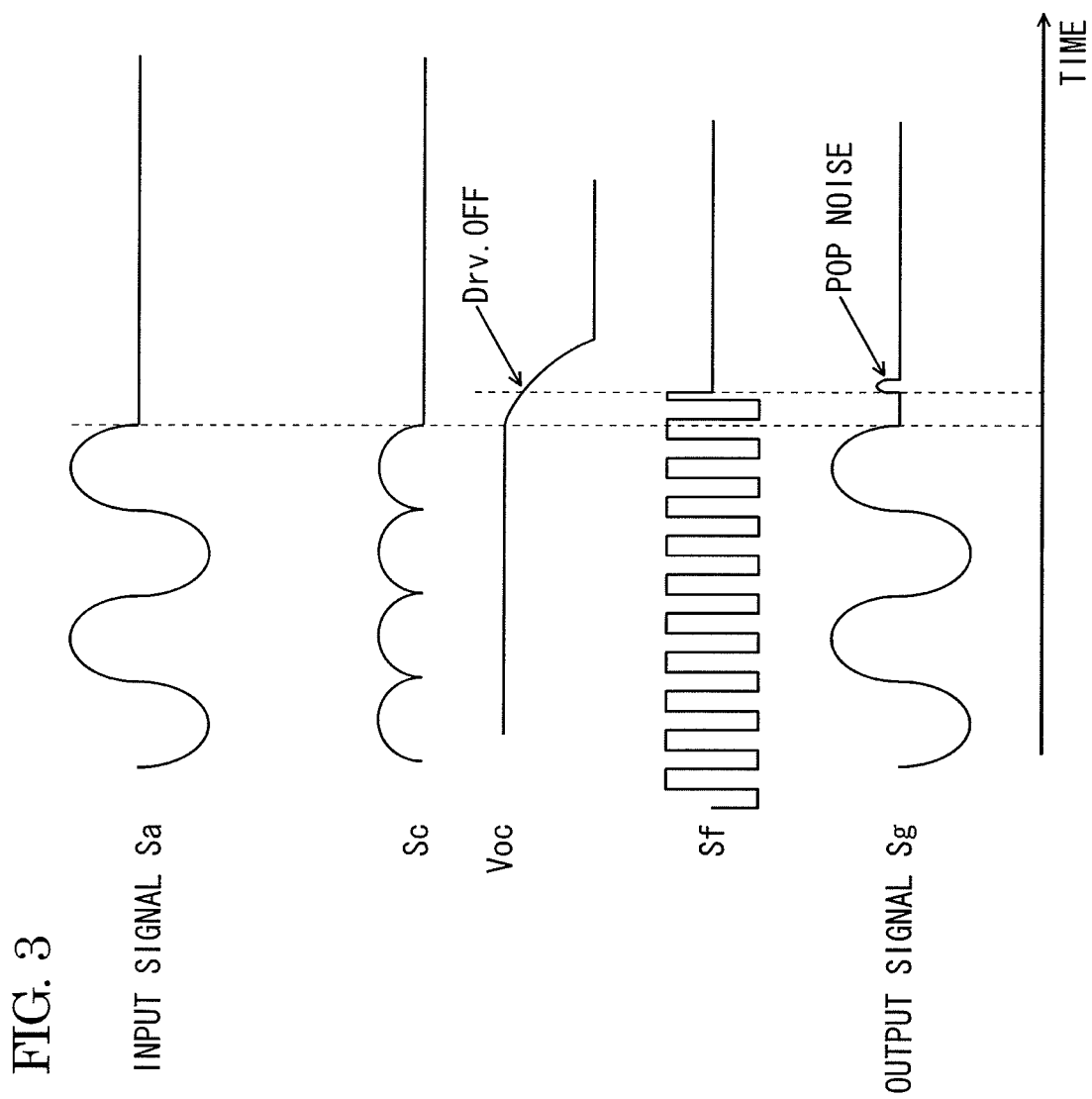
FIG. 3 is a diagram illustrating signal waveforms when the switching operation is stopped in the digital amplifier according to the first embodiment.

FIG. 2 is a diagram illustrating signal waveforms when a switching operation is started in the digital amplifier according to the first embodiment. FIG. 3 is a diagram illustrating signal waveforms when the switching operation is stopped in the digital amplifier according to the first embodiment. A signal Sa shown in FIGS. 2 and 3 is an input signal of the digital amplifier. A signal Sc is an output signal of the input level detection section 103 and is a signal obtained through full-wave rectification of the input signal Sa. A potential Voc is a potential of an output signal of the operation control section 105 and is a signal obtained by smoothing the signal Sc. A signal Sf is a signal indicating a switching operation performed by the switching unit 119 of the digital amplifier section 101. A signal Sg is a signal obtained by amplifying the input signal Sa and is an output signal of the digital amplifier. The signal Sg is output from the output end 107.

As shown in FIG. 2, when the input signal Sa is changed from an approximately 0 V potential state, that is, a state where the input signal Sa is absent (no signal input state) to a state having a certain level, that is, a state where the input signal Sa exists (signal input state), the potential Voc of the output signal of the operation control section 105 rises. Due to the rising of the potential Voc, the oscillation control unit 115 transmits a digital pulse signal applied from the dead time control unit 113 to the driving unit 117. In addition, the oscillation control unit 115 has a photo coupler and an electronic switch embedded therein. The oscillation control unit 115 has a configuration in which the electronic switch such as a transistor controls a current flowing into an input of the photo coupler, and when the electronic switch is closed such that a current flows, thereby transmitting the digital pulse signal. For this reason, the driving unit 117 starts driving control of the switching unit 119 in response to the input signal Sa. In this way, a switching operation is started, and the signal Sg is output from the output end 107. However, a signal corresponding to the signal Sa until the switching operation is started is not output from the output end 107. In other words, "sound lack" indicated by the dashed line in FIG. 2 occurs. In addition, when the switching operation is started, pop noise occurs due to a resonance phenomenon of the LPF 121.

As shown in FIG. 3, when the input signal Sa is changed from a state having a certain level (signal input state) to an approximately 0 V potential state (no signal input state), the potential Voc of the output signal of the operation control section 105 falls. Due to the falling of the potential Voc, an oscillation operation of the oscillation control unit 115 is stopped (Drv. OFF), and the path where the input signal Sa is input to the driving unit 117 is opened. For this reason, the driving unit 117 stops the driving control of the switching unit 119. In this way, the switching operation is stopped.

However, timing when the switching operation is stopped has no relation to the input signal Sa, and which position of the signal Sf output from the switching unit 119 is the timing cannot be known. Since the areas of the positive and negative varying amounts of the signal Sf do not conform depending on cases, a pop noise component is generated in the LPF 121, and thus unwanted pop noise is output from the speaker.

As described above, according to the present embodiment, the switching operation in the digital amplifier section 101 is started or stopped depending on whether or not the signal Sa is input to the digital amplifier. In other words, the switching operation is performed in a signal input state, and the switching operation is not performed in a no signal input state. Therefore, it is possible to reduce power consumption in the digital amplifier section 101 when no signal is input.

Second Embodiment

Figure 4:
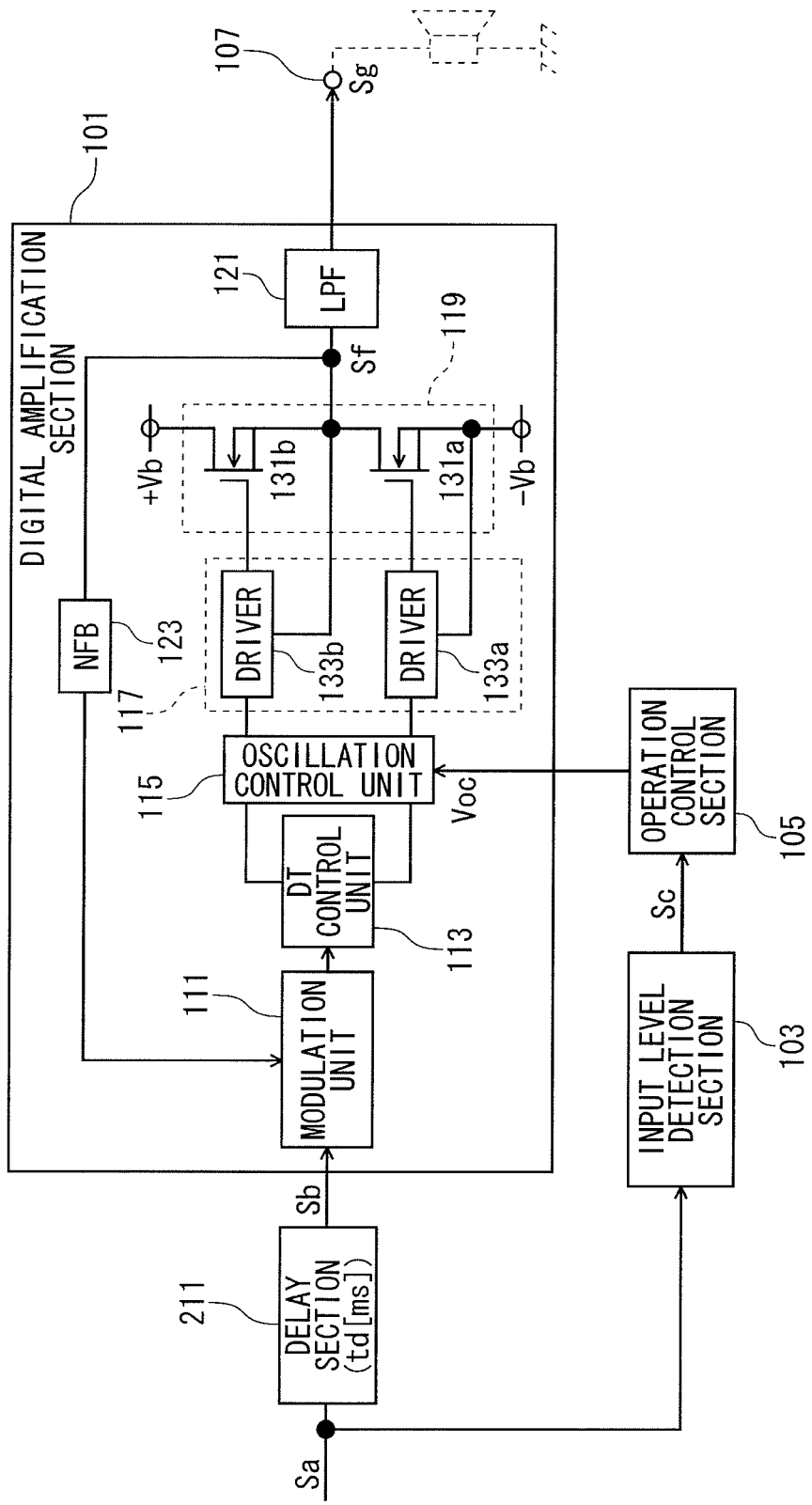
FIG. 4 is a block diagram illustrating a configuration of an output stage of a digital amplifier according to a second embodiment.

FIG. 4 is a block diagram illustrating a configuration of an output stage of a digital amplifier according to the second embodiment. As shown in FIG. 4, the digital amplifier according to the second embodiment further includes a delay section 211 at the front stage of the digital amplifier section 101 in addition to the constituent elements of the digital amplifier according to the first embodiment. The present embodiment is the same as the first embodiment except for this, and the constituent elements common to FIG. 1 are given the same reference numerals in FIG. 4.

The delay section 211 delays transmission of a signal by predetermined time when the signal input to the digital amplifier is transmitted to the constituent element at the rear stage. Therefore, the signal input to the digital amplifier is input to the digital amplifier section 101 after being delayed by the time. In addition, a delay time set in the delay section 211 may be arbitrarily set. Further, a signal input to the input level detection section 103 is the input signal Sa in the same manner as the first embodiment.

Figure 5:
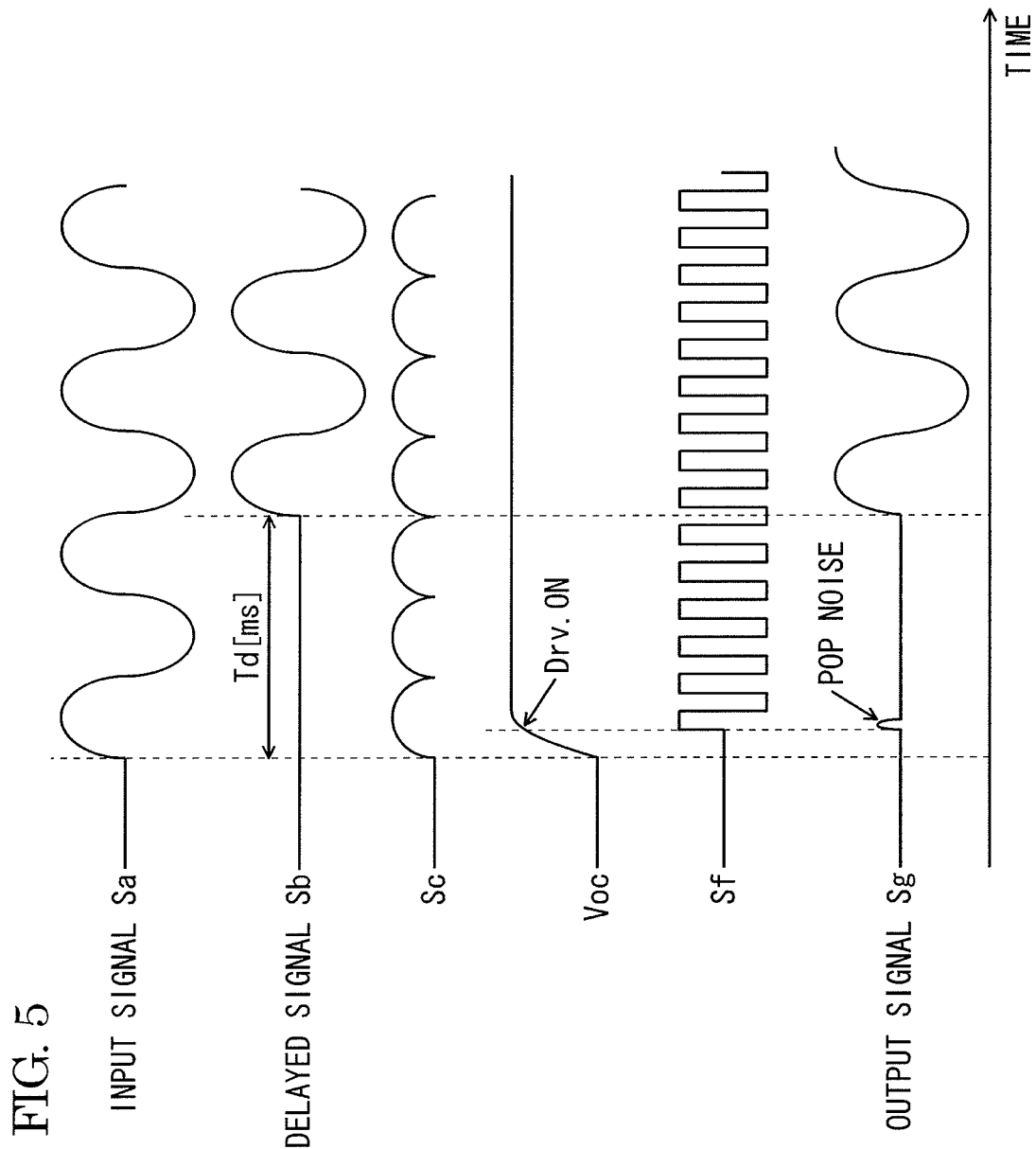
FIG. 5 is a diagram illustrating signal waveforms when a switching operation is started in the digital amplifier according to the second embodiment.
Figure 6:
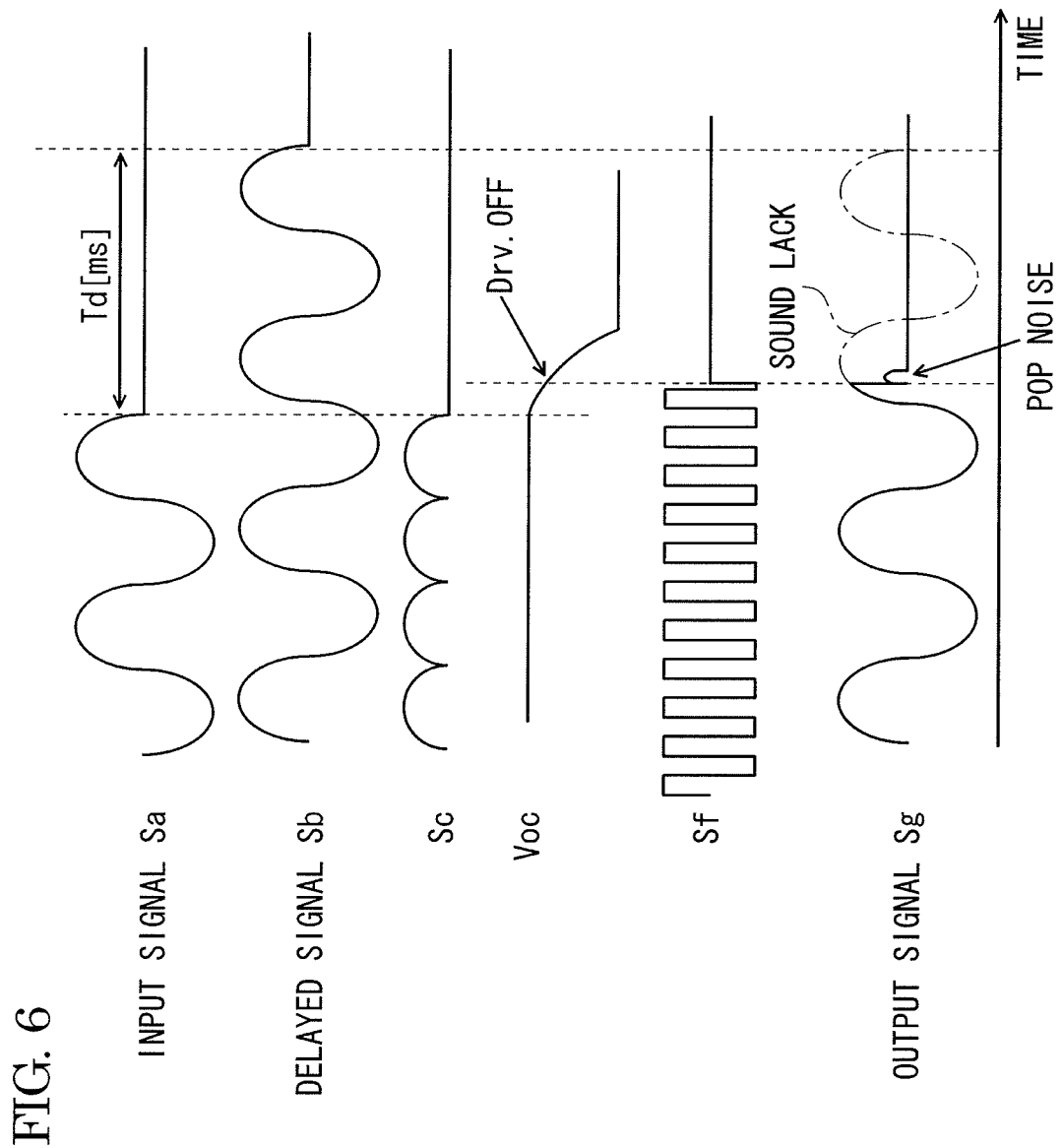
FIG. 6 is a diagram illustrating signal waveforms when the switching operation is stopped in the digital amplifier according to the second embodiment.

FIG. 5 is a diagram illustrating signal waveforms when a switching operation is started in the digital amplifier according to the second embodiment. FIG. 6 is a diagram illustrating signal waveforms when the switching operation is stopped in the digital amplifier according to the second embodiment. A signal Sa shown in FIGS. 5 and 6 is an input signal of the digital amplifier. A signal Sb is an output signal (delayed signal) of the delay section 211 and is input to the digital amplifier section 101. In the example shown in FIGS. 5 and 6, there is a difference of delay time td[ms] on the time axis between the input signal Sa and the delayed signal Sb. A signal Sc is an output signal of the input level detection section 103 and is a signal obtained through full-wave rectification of the input signal Sa. A potential Voc is a potential of an output signal of the operation control section 105 and is a signal obtained by smoothing the signal Sc. A signal Sf is a signal indicating a switching operation performed by the switching unit 119 of the digital amplifier section 101. A signal Sg is a signal obtained by amplifying the signal Sb and is an output signal of the digital amplifier. The signal Sg is output from the output end 107.

As shown in FIG. 5, when the input signal Sa is changed from an absent state (no signal input state) to an existing state (signal input state), the potential Voc of the output signal of the operation control section 105 rises. Due to the rising of the potential Voc, the oscillation control unit 115 oscillates (Drv. ON), and the path where the delayed signal Sb is input to the driving unit 117 is closed. For this reason, the driving unit 117 starts driving control of the switching unit 119 in response to the delayed signal Sb. In this way, a switching operation is started, and the signal Sg is output from the output end 107. However, as shown in FIG. 5, when the switching operation is started, pop noise occurs.

As shown in FIG. 6, when the input signal Sa is changed from an existing state (signal input state) to an absent state (no signal input state), the potential Voc of the output signal of the operation control section 105 falls. Due to the falling of the potential Voc, an oscillation operation of the oscillation control unit 115 is stopped (Drv. OFF), and the path where the delayed signal Sb is input to the driving unit 117 is opened. For this reason, the driving unit 117 stops the driving control of the switching unit 119. In this way, the switching operation is stopped. However, as shown in FIG. 6, when the switching operation is stopped at timing other than the dead time, pop noise occurs and is output from the output end 107. In addition, in the present embodiment, since the switching operation is stopped while the signal Sg is output from the output end 107, "sound lack" indicated by the dashed line in FIG. 6 occurs.

As described above, according to the present embodiment, the switching operation in the digital amplifier section 101 is started or stopped depending on whether or not the signal Sa is input to the digital amplifier, and, therefore, it is possible to reduce power consumption in the digital amplifier section 101 when no signal is input. Further, the signal Sb input to the digital amplifier section 101 is delayed, and thus sound lack does not occur when the digital amplifier section 101 starts the switching operation.

Third Embodiment

Figure 7:
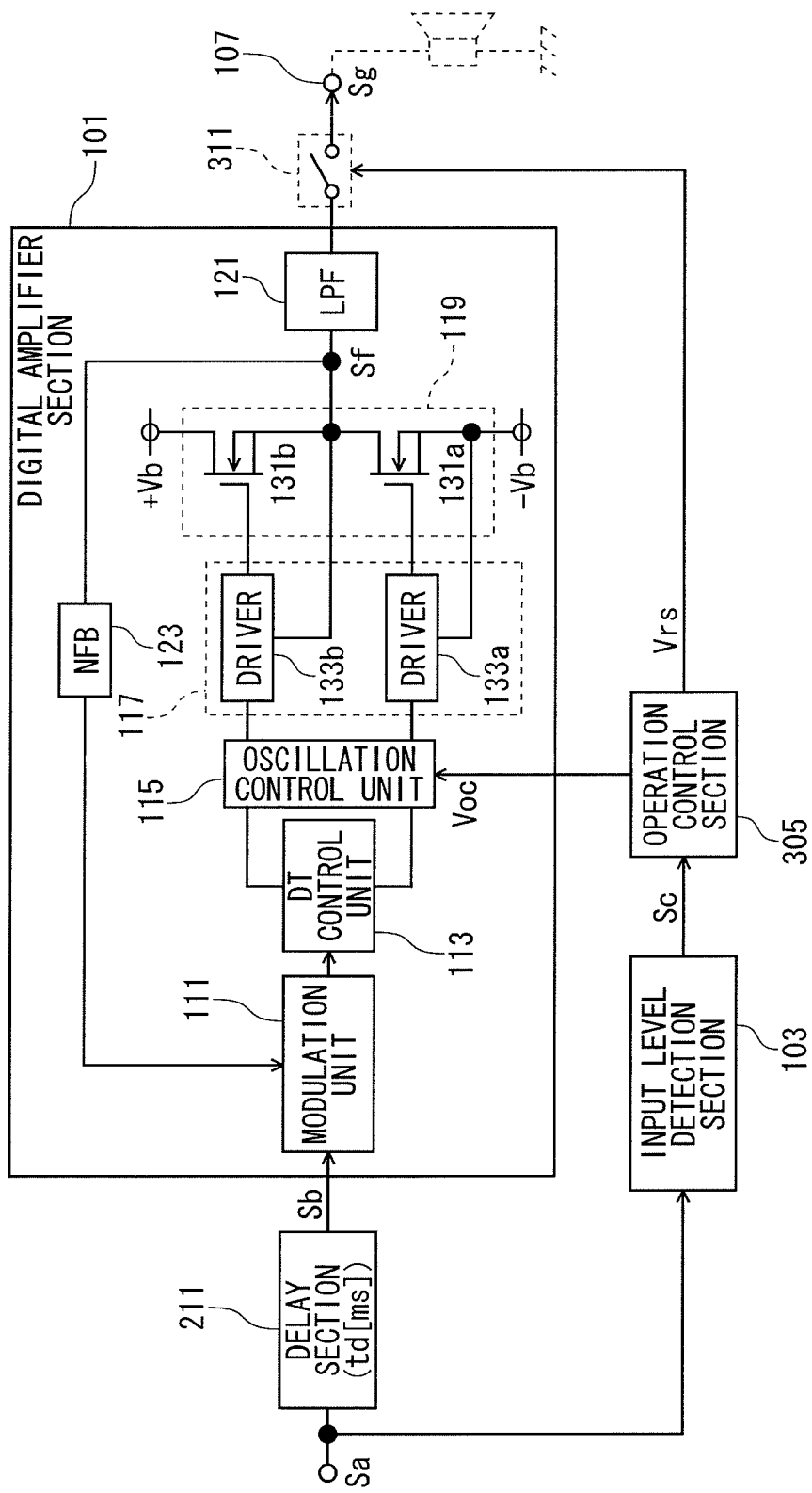
FIG. 7 is a block diagram illustrating a configuration of an output stage of a digital amplifier according to a third embodiment.

FIG. 7 is a block diagram illustrating a configuration of an output stage of a digital amplifier according to the third embodiment. As shown in FIG. 7, the digital amplifier according to the third embodiment further includes a switch 311 at the rear stage of the digital amplifier section 101 in addition to the constituent elements of the digital amplifier according to the second embodiment. In addition, an operation control section 305 of the present embodiment is different from the operation control section 105 of the second embodiment in that it turns the switch 311 on and off. The present embodiment is the same as the second embodiment except for them, and the constituent elements common to FIG. 4 are given the same reference numerals in FIG. 7.

The switch 311 is a relay which is provided on a path where an output signal of the digital amplifier section 101 is output from the output end 107, and opens and closes the path. The switch 311 is a mechanical relay or an electronic relay such as a photo-MOS relay, and is controlled by the operation control section 305. The operation control section 305 of the present embodiment controls not only an oscillation operation of the oscillation control unit 115 but also opening and closing of the switch 311 in response to a signal output from the input level detection section 103. Further, the operation control section 305 includes a time constant circuit which sets each time constant of rising and falling of a potential of a signal output to the oscillation control unit 115, and each time constant of rising and falling of a potential of a signal output to the switch 311.

In the present embodiment, the time constant of rising of a potential of a signal output to the switch 311 from the operation control section 305 is greater than the time constant of rising of a potential of a signal output to the oscillation control unit 115 from the operation control section 305. Therefore, timing when the switch 311 is changed from an open state to a closed state under the control of the operation control section 305 when a signal is input to the digital amplifier is later than start timing of the switching operation in the digital amplifier section 101 under the operation control section 305. However, timing when the switch 311 enters a closed state is smaller than the delay time td.

In the present embodiment, the time constant of falling of a potential of a signal output to the switch 311 from the operation control section 305 is smaller than the time constant of falling of a potential of a signal output to the oscillation control unit 115 from the operation control section 305. Therefore, timing when the switch 311 is changed from a closed state to an open state under the control of the operation control section 305 when no signal is input to the digital amplifier is earlier than stop timing of the switching operation in the digital amplifier section 101 under the operation control section 305.

Figure 8:
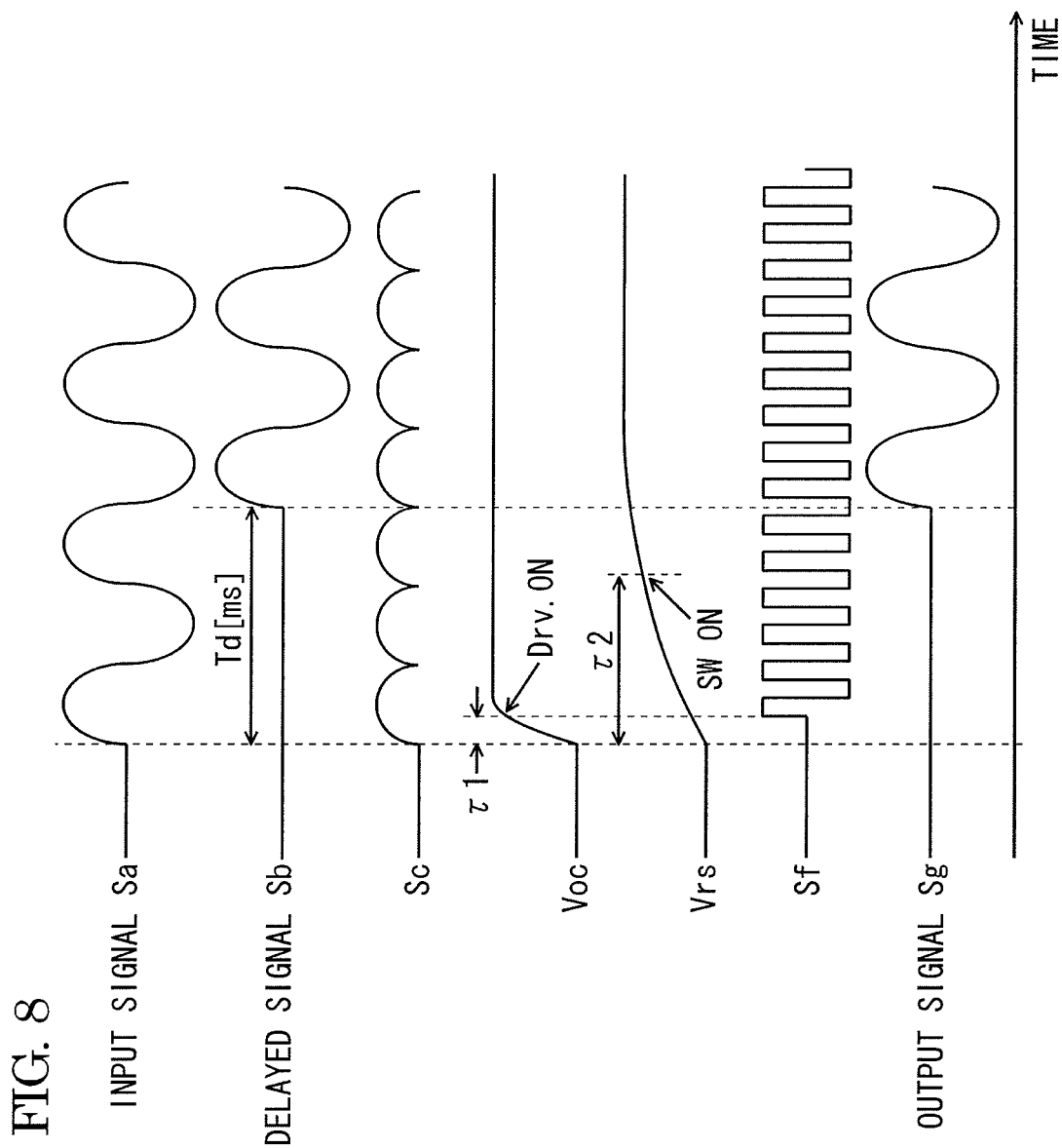
FIG. 8 is a diagram illustrating signal waveforms when a switching operation is started in the digital amplifier according to the third embodiment.

FIG. 8 is a diagram illustrating signal waveforms when a switching operation is started in the digital amplifier according to the third embodiment.

Figure 9:
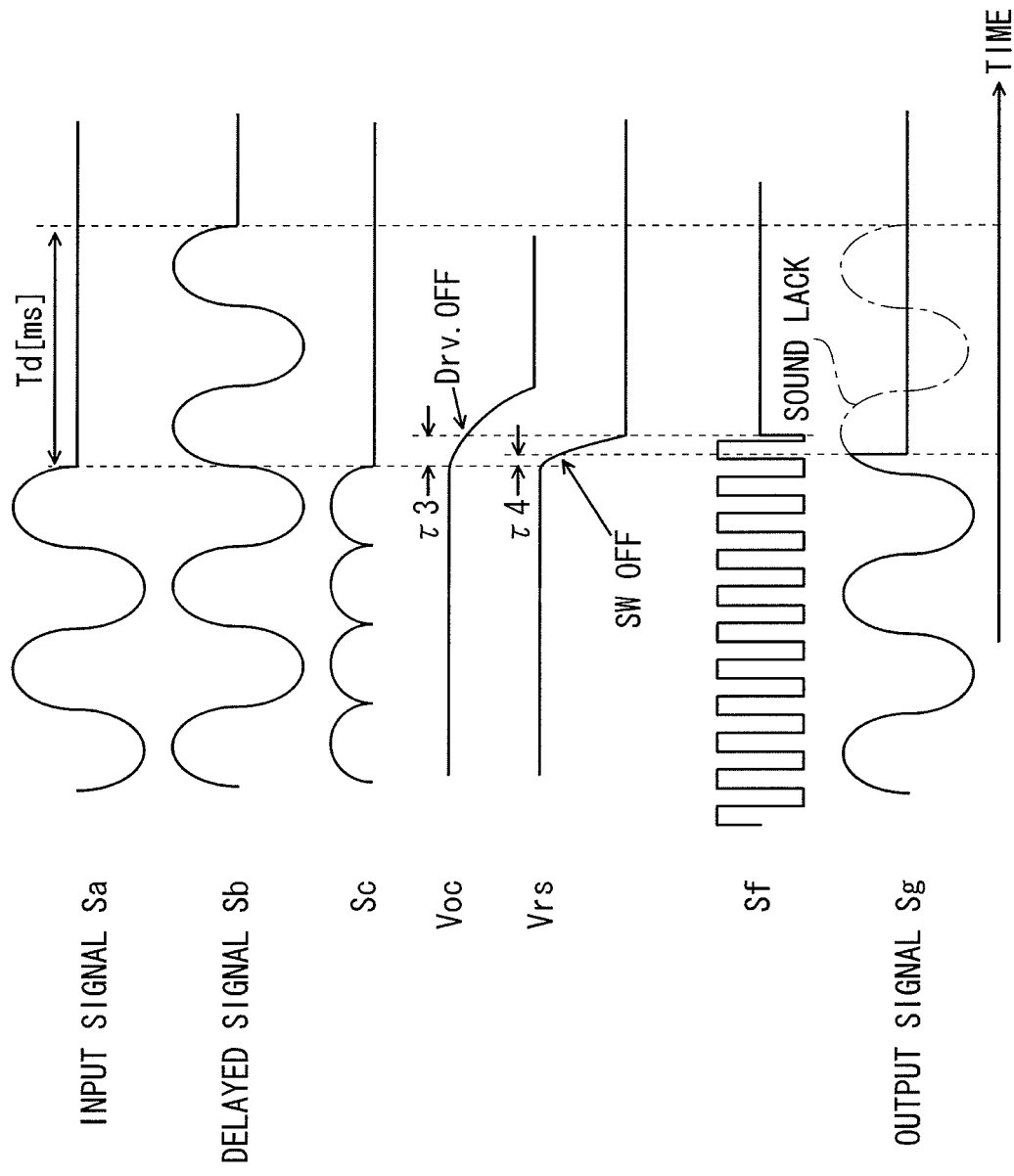
FIG. 9 is a diagram illustrating signal waveforms when the switching operation is stopped in the digital amplifier according to the third embodiment.

FIG. 9 is a diagram illustrating signal waveforms when the switching operation is stopped in the digital amplifier according to the third embodiment. A signal Sa shown in FIGS. 8 and 9 is an input signal of the digital amplifier. A signal Sb is an output signal (delayed signal) of the delay section 211 and is input to the digital amplifier section 101. In the example shown in FIGS. 8 and 9, there is a difference of delay time td[ms] on the time axis between the input signal Sa and the delayed signal Sb. A signal Sc is an output signal of the input level detection section 103 and is a signal obtained through full-wave rectification of the input signal Sa. A potential Voc is a potential of a signal which is output from the operation control section 305 to the oscillation control unit 115, and is a signal obtained by smoothing the signal Sc. A potential Vrs is a potential of a signal which is output from the operation control section 305 to the switch 311, and is a signal obtained by smoothing the signal Sc. A signal Sf is a signal indicating a switching operation performed by the switching unit 119 of the digital amplifier section 101. A signal Sg is a signal obtained by amplifying the signal Sb and is an output signal of the digital amplifier. The signal Sg is output from the output end 107.

As shown in FIG. 8, when the input signal Sa is changed from an absent state (no signal input state) to an existing state (signal input state), the potential Voc of the output signal from the operation control section 305 to the oscillation control unit 115 rises with the time constant τ1, and the potential Vrs of the output signal from the operation control section 305 to the switch 311 rises with the time constant τ2 greater than the time constant τ1. Due to the rising of the potential Voc, the oscillation control unit 115 oscillates (Drv. ON), and the path where the delayed signal Sb is input to the driving unit 117 is closed. For this reason, the driving unit 117 starts driving control of the switching unit 119 in response to the delayed signal Sb. In this way, a switching operation is started. On the other hand, due to the rising of the potential Vrs, the switch 311 is changed from an open state to a closed state (SW ON). As described above, the time constant τ2 is greater than the time constant τ1. For this reason, timing when the switch 311 enters a closed state is within the delay time td but is later than timing when the switching operation is started, as shown in FIG. 8. When the switch 311 enters a closed state, the signal Sg is output from the output end 107.

As shown in FIG. 9, when the input signal Sa is changed from an existing state (signal input state) to an absent state (no signal input state), the potential Voc of the output signal from the operation control section 305 to the oscillation control unit 115 falls with the time constant τ3, and the potential Vrs of the output signal from the operation control section 305 to the switch 311 falls with the time constant τ4 smaller than the time constant τ3. Due to the falling of the potential Vrs, the switch 311 is changed from a closed state to an open state (SW OFF). On the other hand, Due to the falling of the potential Voc, an oscillation operation of the oscillation control unit 115 is stopped (Drv. OFF), and the path where the delayed signal Sb is input to the driving unit 117 is opened. For this reason, the driving unit 117 stops the driving control of the switching unit 119. In this way, the switching operation is stopped. As described above, the time constant τ4 is smaller than the time constant τ3. For this reason, timing when the switch 311 enters an open state is earlier than timing when the switching operation is stopped, as shown in FIG. 9. However, as shown in FIG. 9, since the switch 311 enters an open state while the signal Sg is output from the output end 107, "sound lack" indicated by the dashed line in FIG. 9 occurs.

As described above, according to the present embodiment, the switching operation in the digital amplifier section 101 is started or stopped depending on whether or not the signal Sa is input to the digital amplifier, and, therefore, it is possible to reduce power consumption in the digital amplifier section 101 when no signal is input. Further, the signal Sb input to the digital amplifier section 101 is delayed, and thus sound lack does not occur when the digital amplifier section 101 starts the switching operation. In addition, since opening and closing of the switch 311 are controlled such that the switch 311 enters an open state at the time when pop noise may occur, pop noise is not output from the output end 107.

Fourth Embodiment

Figure 10:
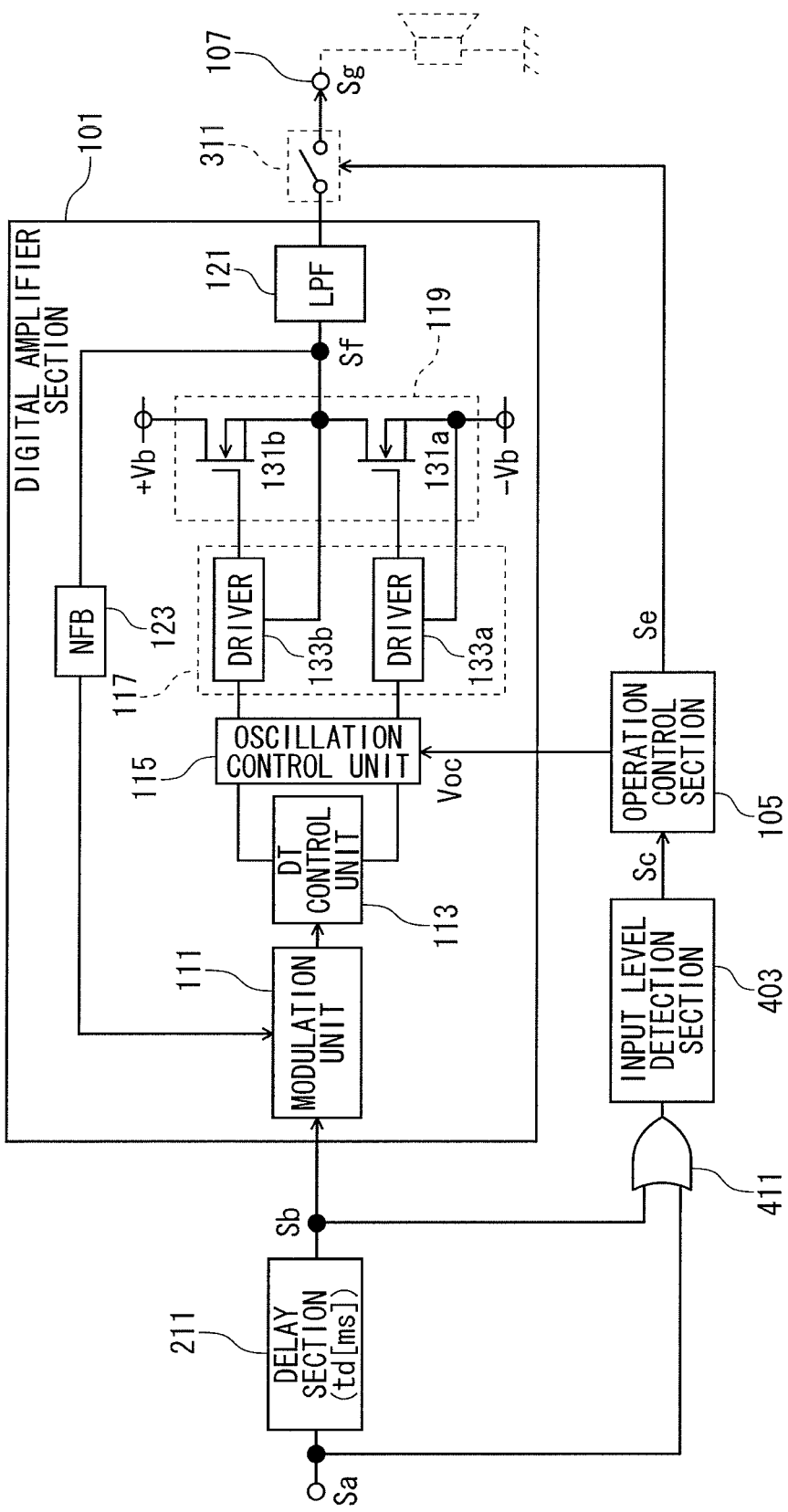
FIG. 10 is a block diagram illustrating a configuration of an output stage of a digital amplifier according to a fourth embodiment.

FIG. 10 is a block diagram illustrating a configuration of an output stage of a digital amplifier according to the fourth embodiment. As shown in FIG. 10, the digital amplifier according to the fourth embodiment further includes an OR circuit 411 at the front stage of the input level detection section 103 in addition to the constituent elements of the digital amplifier according to the third embodiment. In addition, an input level detection section 403 of the present embodiment is different from the input level detection section 103 of the third embodiment in that an output signal from the OR circuit 411 is input thereto. The present embodiment is the same as the third embodiment except for them, and the constituent elements common to FIG. 7 are given the same reference numerals in FIG. 10.

The signal Sa input to the digital amplifier and the output signal Sb of the delay section 211 are input to the OR circuit 411. The OR circuit 411 outputs a logical sum signal of the signal Sa input to the digital amplifier and the output signal Sb of the delay section 211. In addition, the logical sum signal is a signal where the output signal Sb of the delay section 211 is convoluted on the signal Sa input to the digital amplifier. The input level detection section 403 controls an oscillation operation of the oscillation control unit 115 of the digital amplifier section 101 in response to the logical sum signal output from the OR circuit 411.

Figure 11:
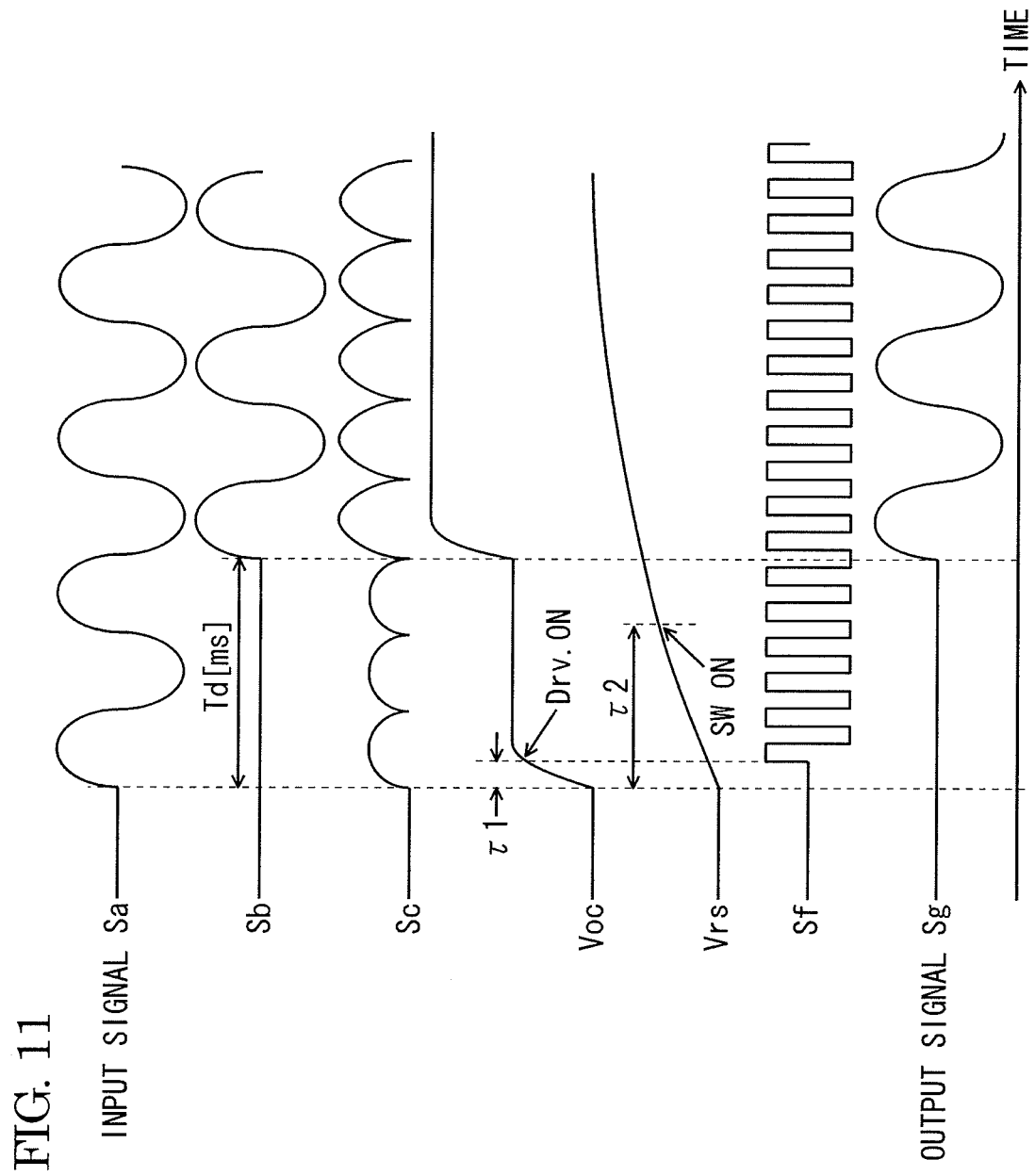
FIG. 11 is a diagram illustrating signal waveforms when a switching operation is started in the digital amplifier according to the fourth embodiment.
Figure 12:
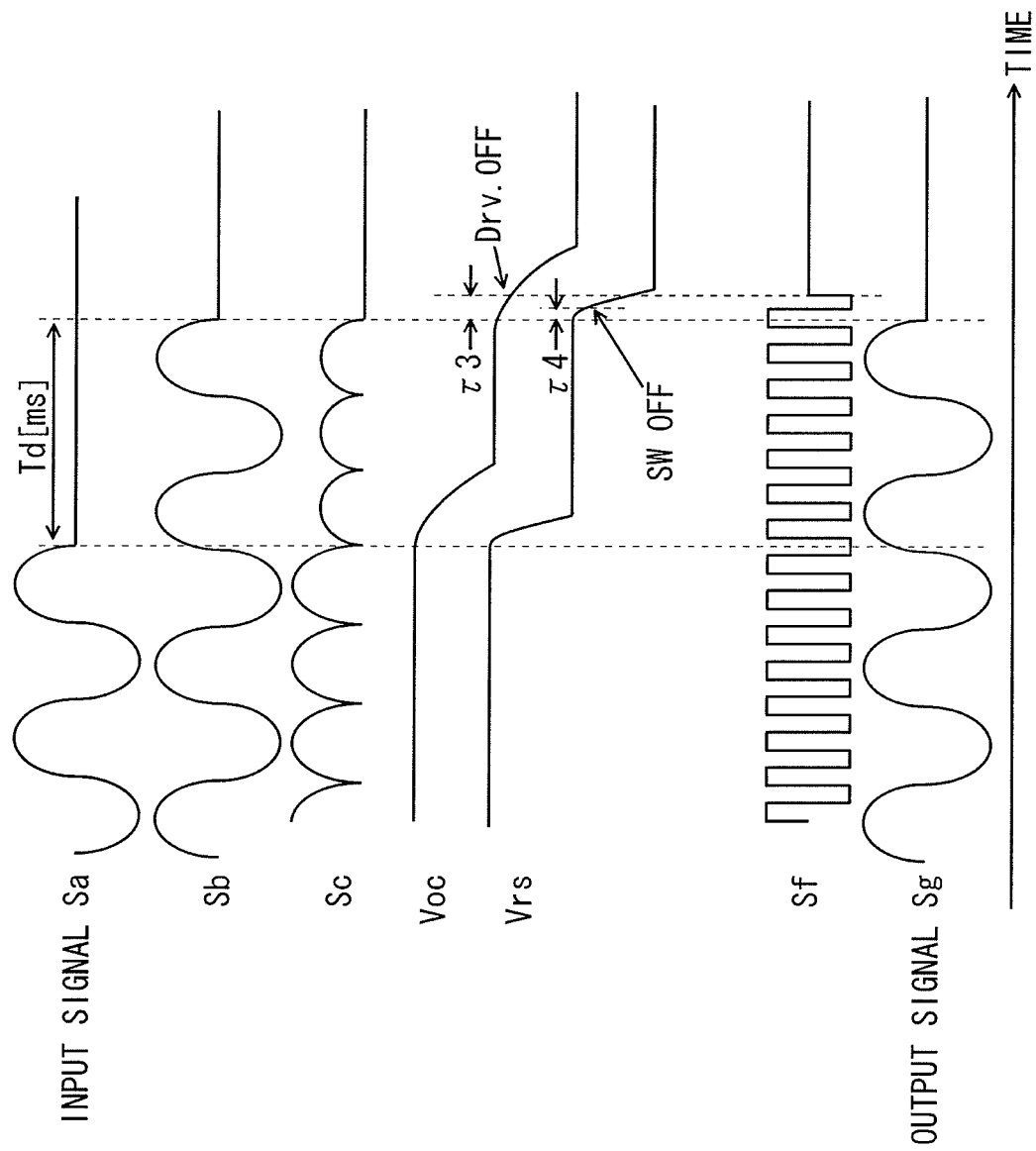
FIG. 12 is a diagram illustrating signal waveforms when the switching operation is stopped in the digital amplifier according to the fourth embodiment.

FIG. 11 is a diagram illustrating signal waveforms when a switching operation is started in the digital amplifier according to the fourth embodiment. FIG. 12 is a diagram illustrating signal waveforms when the switching operation is stopped in the digital amplifier according to the fourth embodiment. A signal Sa shown in FIGS. 11 and 12 is an input signal of the digital amplifier. A signal Sb is an output signal (delayed signal) of the delay section 211 and is input to the digital amplifier section 101. In the example shown in FIGS. 11 and 12, there is a difference of delay time td[ms] on the time axis between the input signal Sa and the delayed signal Sb. A signal Sc is an output signal of the input level detection section 403 and is a signal where a signal obtained through full-wave rectification of the delayed signal Sb is convoluted on a signal obtained through full-wave rectification of the input signal Sa. A potential Voc is a potential of a signal which is output from the operation control section 105 to the oscillation control unit 115, and is a signal obtained by smoothing the signal Sc. A potential Vrs is a potential of a signal which is output from the operation control section 105 to the switch 311, and is a signal obtained by smoothing the signal Sc. A signal Sf is a signal indicating a switching operation performed by the switching unit 119 of the digital amplifier section 101. A signal Sg is a signal obtained by amplifying the signal Sb and is an output signal of the digital amplifier. The signal Sg is output from the output end 107.

As shown in FIG. 11, when the input signal Sa is changed from an absent state (no signal input state) to an existing state (signal input state), the potential Voc of the output signal from the operation control section 105 to the oscillation control unit 115 rises with the time constant τ1, and the potential Vrs of the output signal from the operation control section 105 to the switch 311 rises with the time constant T2 greater than the time constant τ1. Due to the rising of the potential Voc, the oscillation control unit 115 oscillates (Dry. ON), and the path where the delayed signal Sb is input to the driving unit 117 is closed. For this reason, the driving unit 117 starts driving control of the switching unit 119 in response to the delayed signal Sb. In this way, a switching operation is started. On the other hand, due to the rising of the potential Vrs, the switch 311 is changed from an open state to a closed state (SW ON). As described above, the time constant τ2 is greater than the time constant τ1. For this reason, timing when the switch 311 enters a closed state is within the delay time td but is later than timing when the switching operation is started, as shown in FIG. 11. When the switch 311 enters a closed state, the signal Sg is output from the output end 107.

As shown in FIG. 12, when the input signal Sa is changed from an existing state (signal input state) to an absent state (no signal input state), the potential Voc of the output signal from the operation control section 105 to the oscillation control unit 115 falls, and the potential Vrs of the output signal from the operation control section 105 to the switch 311 falls. If the delay time Td has elapsed from a state where the input signal Sa does not exist, the potential Voc falls with the time constant τ3, and the potential Vrs falls with the time constant T4 smaller than the time constant τ3. Due to the falling of the potential Vrs to a predetermined voltage, the switch 311 is changed from a closed state to an open state (SW OFF). On the other hand, Due to the falling of the potential Voc to a predetermined voltage, an oscillation operation of the oscillation control unit 115 is stopped (Drv. OFF), and the path where the delayed signal Sb is input to the driving unit 117 is opened. For this reason, the driving unit 117 stops the driving control of the switching unit 119. In this way, the switching operation is stopped. As described above, the time constant τ4 is smaller than the time constant τ3. For this reason, timing when the switch 311 enters an open state is earlier than timing when the switching operation is stopped, as shown in FIG. 9.

As described above, according to the present embodiment, the switching operation in the digital amplifier section 101 is started or stopped depending on whether or not the signal Sa is input to the digital amplifier, and, therefore, it is possible to reduce power consumption in the digital amplifier section 101 when no signal is input. Further, the signal Sb input to the digital amplifier section 101 is delayed, and thus sound lack does not occur when the digital amplifier section 101 starts the switching operation. In addition, since opening and closing of the switch 311 are controlled such that the switch 311 enters an open state at the time when pop noise may occur, pop noise is not output from the output end 107. Furthermore, even in a no signal input state, the switch 311 does not enter an open state until at least the delay time has elapsed from a state where the input signal Sa does not exist, and thus sound lack does not occur.

Fifth Embodiment

Figure 13:
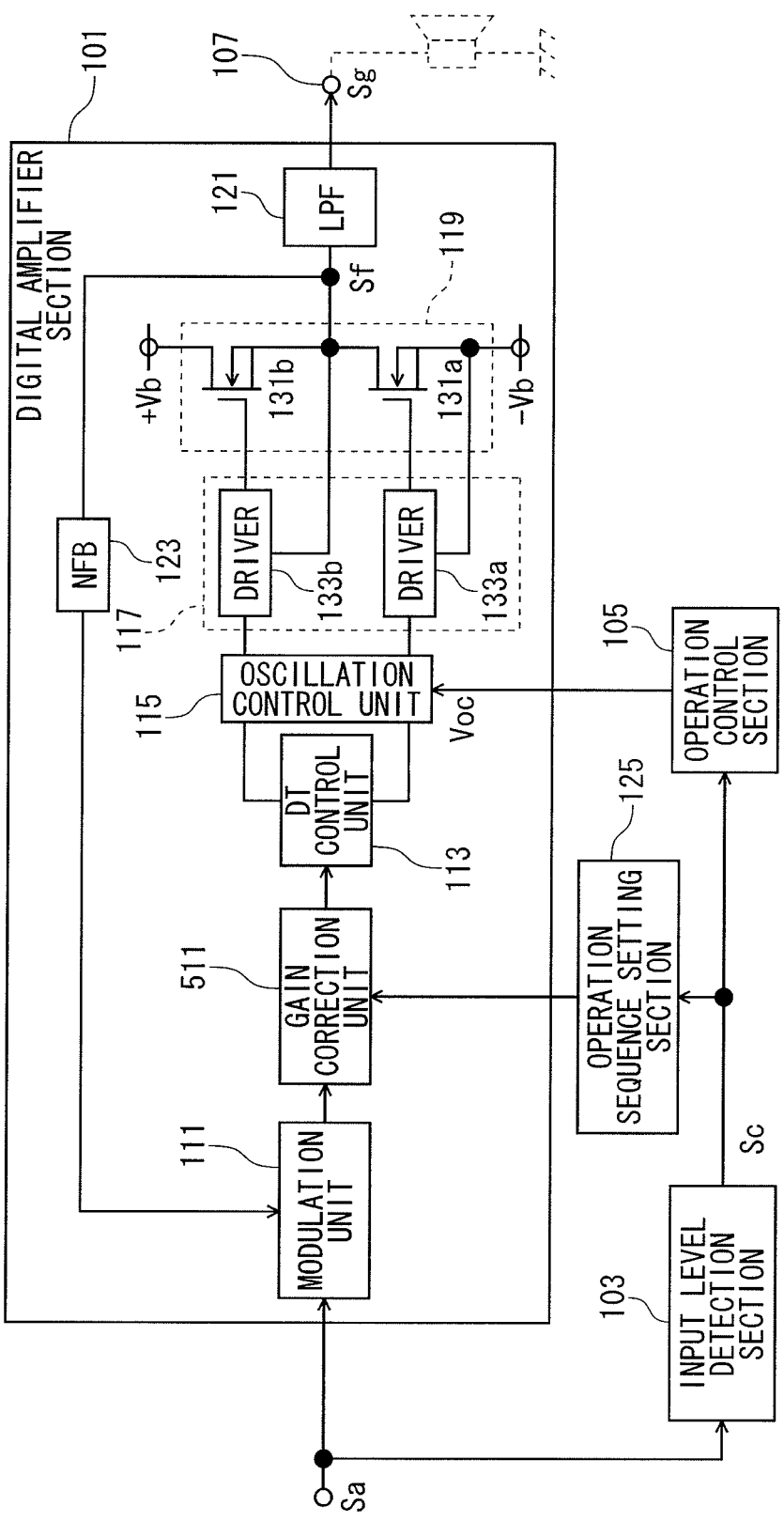
FIG. 13 is a block diagram illustrating a configuration of an output stage of a digital amplifier according to a fifth embodiment.

FIG. 13 is a block diagram illustrating a configuration of an output stage of a digital amplifier according to the fifth embodiment. As shown in FIG. 13, the digital amplifier according to the fifth embodiment further includes an operation sequence setting section 125 in addition to the constituent elements of the digital amplifier according to the first embodiment. In addition, a signal Sc output from the input level detection section 103 is input to the operation sequence setting section 125. The digital amplifier section 101 of the present embodiment further includes a gain correction unit 511 between the modulation unit 111 and the DT control unit 113. The present embodiment is the same as the first embodiment except for them, and the constituent elements common to FIG. 1 are given the same reference numerals in FIG. 13.

Since the negative feedback by the NFB 123 is not applied for the time immediately after oscillation start of the oscillation control unit 115 until an output of the switching unit 119 reaches the modulation unit 111 via the NFB 123, reproducibility as a digital amplifier is reduced. The reduction in the reproducibility refers to, specifically, distortion of an output signal of the digital amplifier due to reduction or the like in a power supply voltage supplied to the digital amplifier. The gain correction unit 511 performs correction for increasing a gain of the digital amplifier section 101 in order to compensate for the reduction in the reproducibility. In addition, a correction amount of a gain by the gain correction unit 511 is variable, and may be set by the operation sequence setting section 125. When a signal is input to the digital amplifier, the operation sequence setting section 125 drives the gain correction unit 511 for a predetermined time immediately after the signal is input.

According to the present embodiment, the gain correction unit 511 corrects a gain of the digital amplifier section 101 for a predetermined time immediately after a signal is input to the digital amplifier. For this reason, it is possible to compensate for reduction in the reproducibility of the signal immediately after oscillation start of the oscillation control unit 115. In addition, in the present embodiment, the gain correction unit 511 is disposed on the rear stage side of the modulation unit 111 but may be disposed at the front stage of the modulation unit 111. Even in this case, it is possible to compensate for reduction in the reproducibility.

Sixth Embodiment

Figure 14:
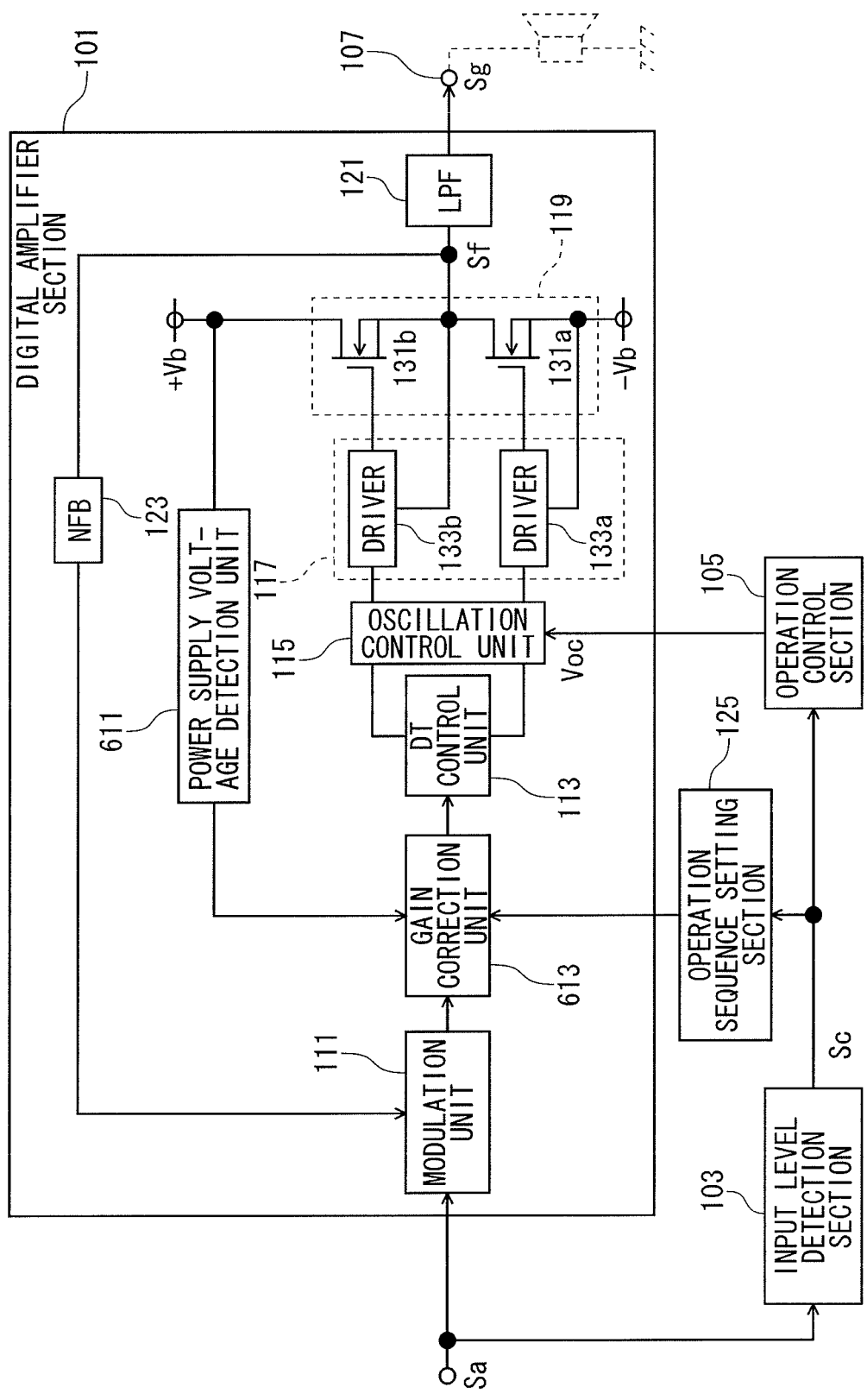
FIG. 14 is a block diagram illustrating a configuration of an output stage of a digital amplifier according to a sixth embodiment.

FIG. 14 is a block diagram illustrating a configuration of an output stage of a digital amplifier according to the sixth embodiment. As shown in FIG. 14, the digital amplifier according to the sixth embodiment further includes a power supply voltage detection unit 611 in the digital amplifier section 101 in addition to the constituent elements of the digital amplifier according to the fifth embodiment. In addition, a gain correction unit 613 of the present embodiment is different from the gain correction unit 511 of the fifth embodiment in that an output signal from the power supply voltage detection unit 611 is input thereto. The present embodiment is the same as the fifth embodiment except for them, and the constituent elements common to FIG. 13 are given the same reference numerals in FIG. 14.

The power supply voltage detection unit 611 detects a power supply voltage Vb, and sends a signal indicating the detection result to the gain correction unit 613. The gain correction unit 613 of the present embodiment corrects a gain of the digital amplifier section 101 in response to the power supply voltage Vb indicated by the signal sent from the power supply voltage detection unit 611. For example, when an actual value of the power supply voltage Vb is lower than a regulated value, a gain of the digital amplifier section 101 is reduced. Therefore, the gain correction unit 613 performs gain correction corresponding to a reduced amount from a desired value of the power supply voltage Vb.

According to the present embodiment, a gain can be corrected according to a variation in the power supply voltage Vb in addition to setting of a gain correction amount by the operation sequence setting section 125, and thus the gain correction can be performed with higher accuracy than in the fifth embodiment.

Seventh Embodiment

Figure 15:
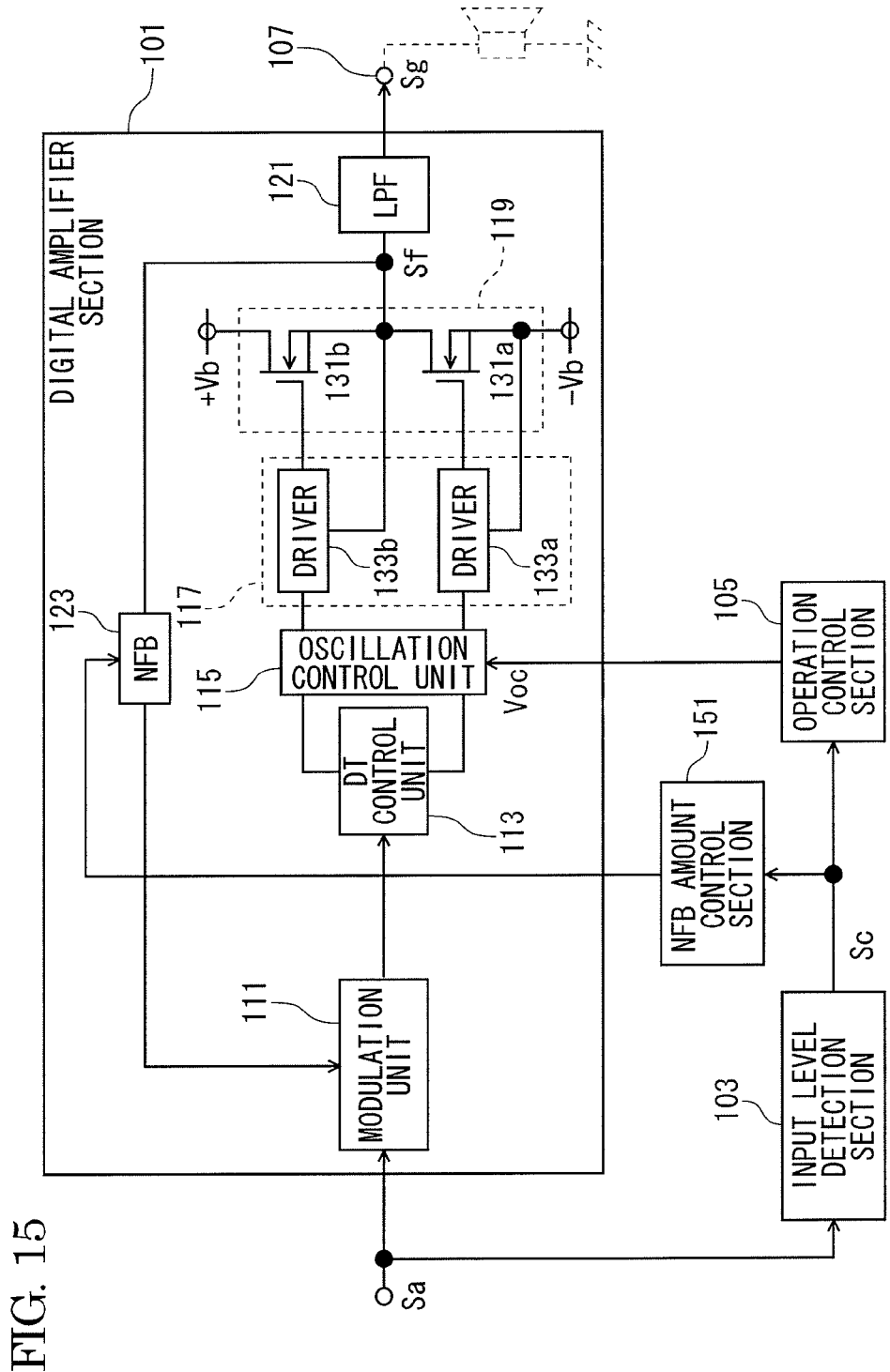
FIG. 15 is a block diagram illustrating a configuration of an output stage of a digital amplifier according to a seventh embodiment.

FIG. 15 is a block diagram illustrating a configuration of an output stage of a digital amplifier according to the seventh embodiment. As shown in FIG. 15, the digital amplifier according to the seventh embodiment further includes an NFB amount control section 151 at the rear stage of the input level detection section 103 in addition to the constituent elements of the digital amplifier according to the first embodiment. In addition, a signal Sc output from the input level detection section 103 is input to the NFB amount control section 151. The present embodiment is the same as the first embodiment except for them, and the constituent elements common to FIG. 1 are given the same reference numerals in FIG. 15.

The NFB amount control section 151 controls a feedback amount to the modulation unit 111 by the NFB 123. In addition, an order of the NFB 123 is variable, and, typically, a second-order or more low-pass filter having favorable attenuation characteristics is formed in order to secure reproducibility of a high frequency signal around 20 kHz input to the digital amplifier section 101. In addition, the higher the order of the NFB 123, the more the NFB amount.

A second-order or more NFB has a lower tracking speed for a switching waveform of an input signal Sf than that of a first-order NFB having a small NFB amount. For this reason, NFB is not applied and reproducibility as a digital amplifier is low immediately after the switching unit 119 starts a switching operation. Therefore, when a signal is input to the digital amplifier, the NFB amount control section 151 controls the NFB 123 so as to decrease an order of the NFB 123 to a first order for a predetermined time immediately after the signal is input. Accordingly, it is possible to prevent reduction in the reproducibility of a signal immediately after oscillation start of the oscillation control unit 115.

Eighth Embodiment

Figure 16:
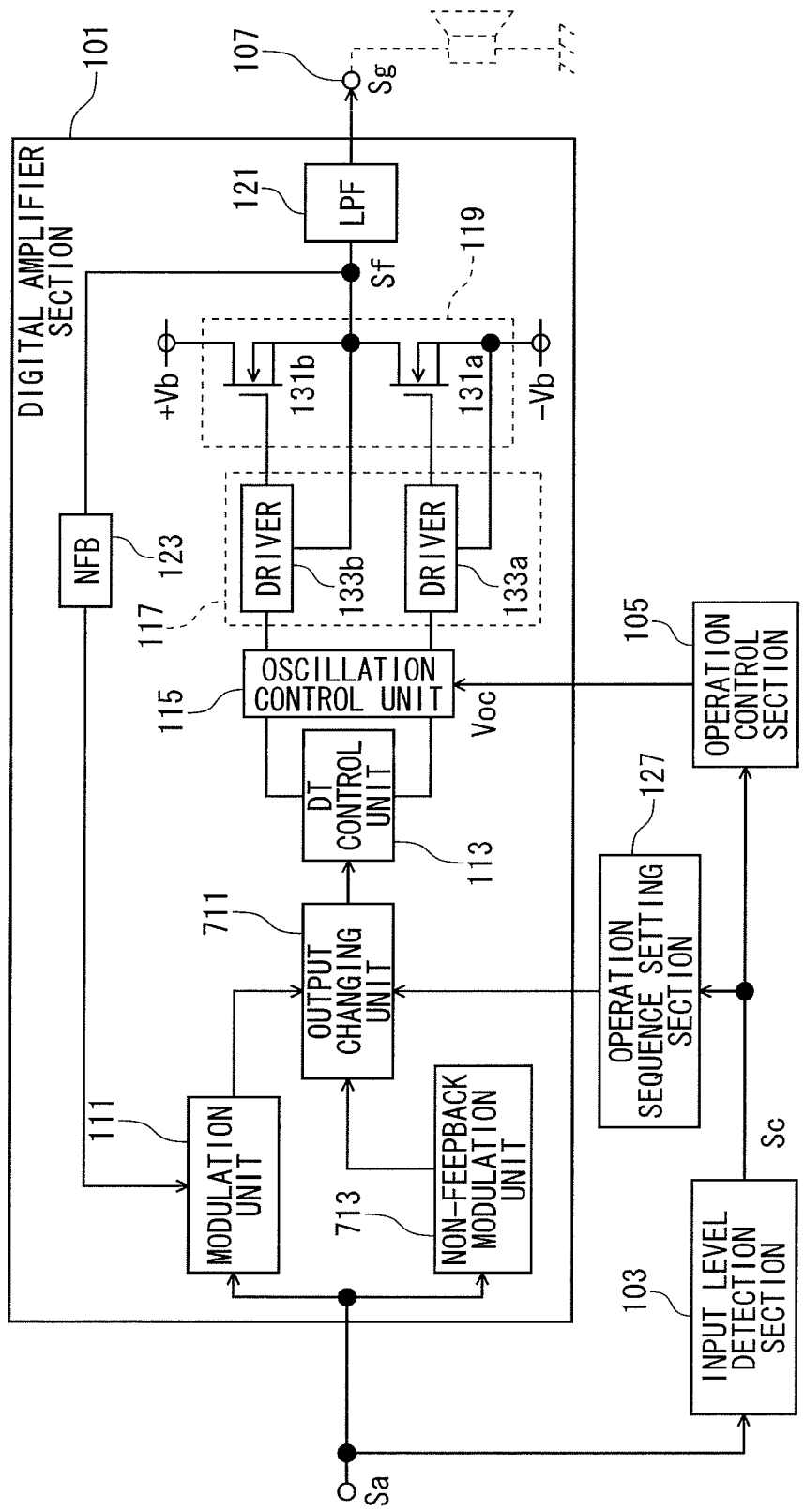
FIG. 16 is a block diagram illustrating a configuration of an output stage of a digital amplifier according to an eighth embodiment.

FIG. 16 is a block diagram illustrating a configuration of an output stage of a digital amplifier according to the eighth embodiment. As shown in FIG. 16, the digital amplifier according to the eighth embodiment further includes an operation sequence setting section 127 in addition to the constituent elements of the digital amplifier according to the first embodiment. In addition, a signal Sc output from the input level detection section 103 is input to the operation sequence setting section 127. The digital amplifier section 101 of the present embodiment further includes an output changing unit 711 between the modulation unit 111 and the DT control unit 113, and a non-feedback modulation unit 713 in parallel to the modulation unit 111. The present embodiment is the same as the first embodiment except for them, and the constituent elements common to FIG. 1 are given the same reference numerals in FIG. 16.

The non-feedback modulation unit 713 is, for example, a PWM (Pulse Width Modulation) circuit, and converts a signal input to the digital amplifier section 101 into a digital pulse signal. In addition, unlike the modulation unit 111, a feedback signal from the NFB 123 is not input to the non-feedback modulation unit 713. Therefore, the non-feedback modulation unit 713 does not perform correction responding to the feedback signal. The output changing unit 711 changes a signal output to the DT control unit 113 to either a digital pulse signal converted by the modulation unit 111 or a digital pulse signal converted by the non-feedback modulation unit 713. When a signal is input to the digital amplifier, the operation sequence setting section 127 controls the output changing unit 711 such that the output changing unit 711 outputs a signal from the non-feedback modulation unit 713 for a predetermined time immediately after the signal is input.

In the first embodiment, in a case where the modulation unit 111 is constituted by an OP amplifier with a low slew rate, if a PWM carrier (approximately 200 kHz to 500 kHz) output from the switching unit 119 is directly input to the modulation unit 111, linearity of the OP amplifier with respect to the PWM carrier is reduced, and thus the reproducibility is reduced. In this case, a low-pass filter is embedded in the NFB 123 so as to attenuate the PWM carrier, and thereby it is possible to prevent the reproducibility from being reduced by preventing reduction in the linearity of the OP amplifier. However, if the low-pass filter is embedded in the NFB 123, a tracking speed of the input signal Sf with respect to a switch waveform is low. For this reason, NFB is not applied and the reproducibility of a signal input to the digital amplifier is reduced immediately after the switching unit 119 starts a switching operation.

According to the present embodiment, a signal from the non-feedback modulation unit 713 is used for a predetermined time immediately after a signal is input to the digital amplifier. The non-feedback modulation unit 713 does not originally perform correction using a feedback signal and thus is not influenced by presence or absence of the feedback signal from the NFB 123. Therefore, it is possible to prevent reduction in the reproducibility of a signal immediately after oscillation start of the oscillation control unit 115.

In addition, in the above description, the output changing unit 711 changes an output signal either a signal from the modulation unit 111 or a signal from the non-feedback modulation unit 713; however, a synthesized signal may be output by gradually changing a ratio of the two signals.

Ninth Embodiment

Figure 17:
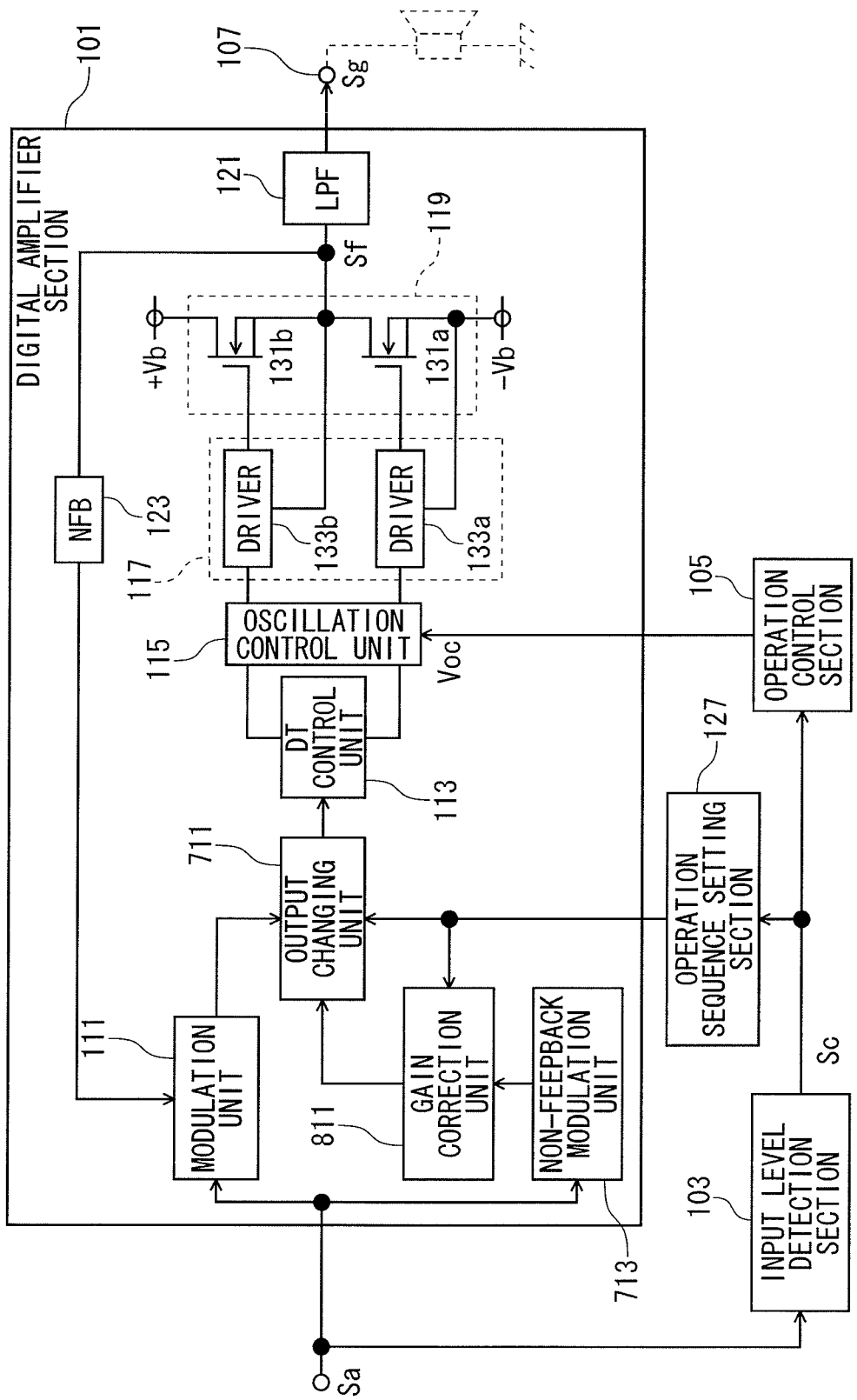
FIG. 17 is a block diagram illustrating a configuration of an output stage of a digital amplifier according to a ninth embodiment.

FIG. 17 is a block diagram illustrating a configuration of an output stage of a digital amplifier according to the ninth embodiment. As shown in FIG. 17, the digital amplifier according to the ninth embodiment further includes a gain correction unit 811 between the non-feedback modulation unit 713 and the output changing unit 711 in the digital amplifier section 101 in addition to the constituent elements of the digital amplifier according to the eighth embodiment. The present embodiment is the same as the eighth embodiment except for them, and the constituent elements common to FIG. 16 are given the same reference numerals in FIG. 17.

When a signal is input to the digital amplifier, the operation sequence setting section 127 drives the gain correction unit 811 for a predetermined time immediately after the signal is input. A digital pulse signal from the non-feedback modulation unit 713 is output to the gain correction unit 811. The gain correction unit 811 corrects a gain of the digital amplifier section 101 in order to compensate for reduction in the reproducibility.

According to the present embodiment, a signal from the non-feedback modulation unit 713 is used and the gain correction unit 811 corrects a gain of the digital amplifier section 101 for a predetermined time immediately after a signal is input to the digital amplifier. For this reason, although reduction in the reproducibility of a signal immediately after oscillation start of the oscillation control unit 115 cannot be completely prevented by the use of the non-feedback modulation unit 713, the gain correction unit 811 corrects a gain of the digital amplifier section 101. Therefore, it is possible to more favorably compensate for reduction in the reproducibility of a signal immediately after oscillation start of the oscillation control unit 115.

Tenth Embodiment

Figure 18:
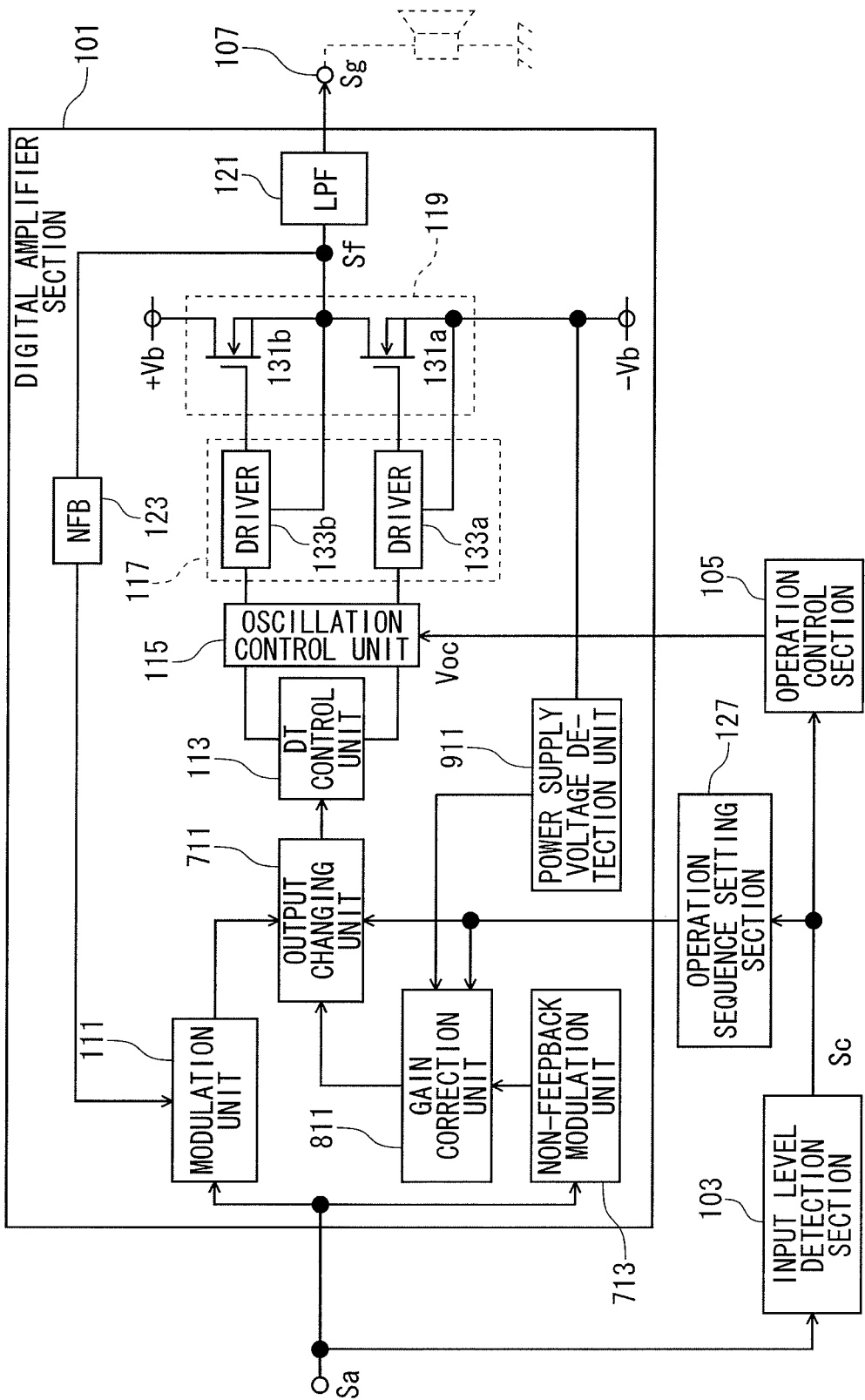
FIG. 18 is a block diagram illustrating a configuration of an output stage of a digital amplifier according to a tenth embodiment.

FIG. 18 is a block diagram illustrating a configuration of an output stage of a digital amplifier according to the tenth embodiment. As shown in FIG. 18, the digital amplifier according to the tenth embodiment further includes a power supply voltage detection unit 911 in the digital amplifier section 101 in addition to the constituent elements of the digital amplifier according to the ninth embodiment. The present embodiment is the same as the ninth embodiment except for them, and the constituent elements common to FIG. 17 are given the same reference numerals in FIG. 18.

The power supply voltage detection unit 911 detects a power supply voltage Vb and sends a signal indicating the detection result to the gain correction unit 811. When a signal is input to the digital amplifier, the operation sequence setting section 127 drives the gain correction unit 811 for a predetermined time immediately after the signal is input. The gain correction unit 811 of the present embodiment corrects a gain of the digital amplifier section 101 in response to the power supply voltage Vb indicated by the signal sent from the power supply voltage detection unit 911. For example, when an actual value of the power supply voltage Vb is lower than a regulated value, a gain of the digital amplifier section 101 is reduced. Therefore, the gain correction unit 811 performs gain correction corresponding to a reduced amount from a desired value of the power supply voltage Vb.

According to the present embodiment, a gain can be corrected according to a variation in the power supply voltage Vb.

Eleventh Embodiment

Figure 19:
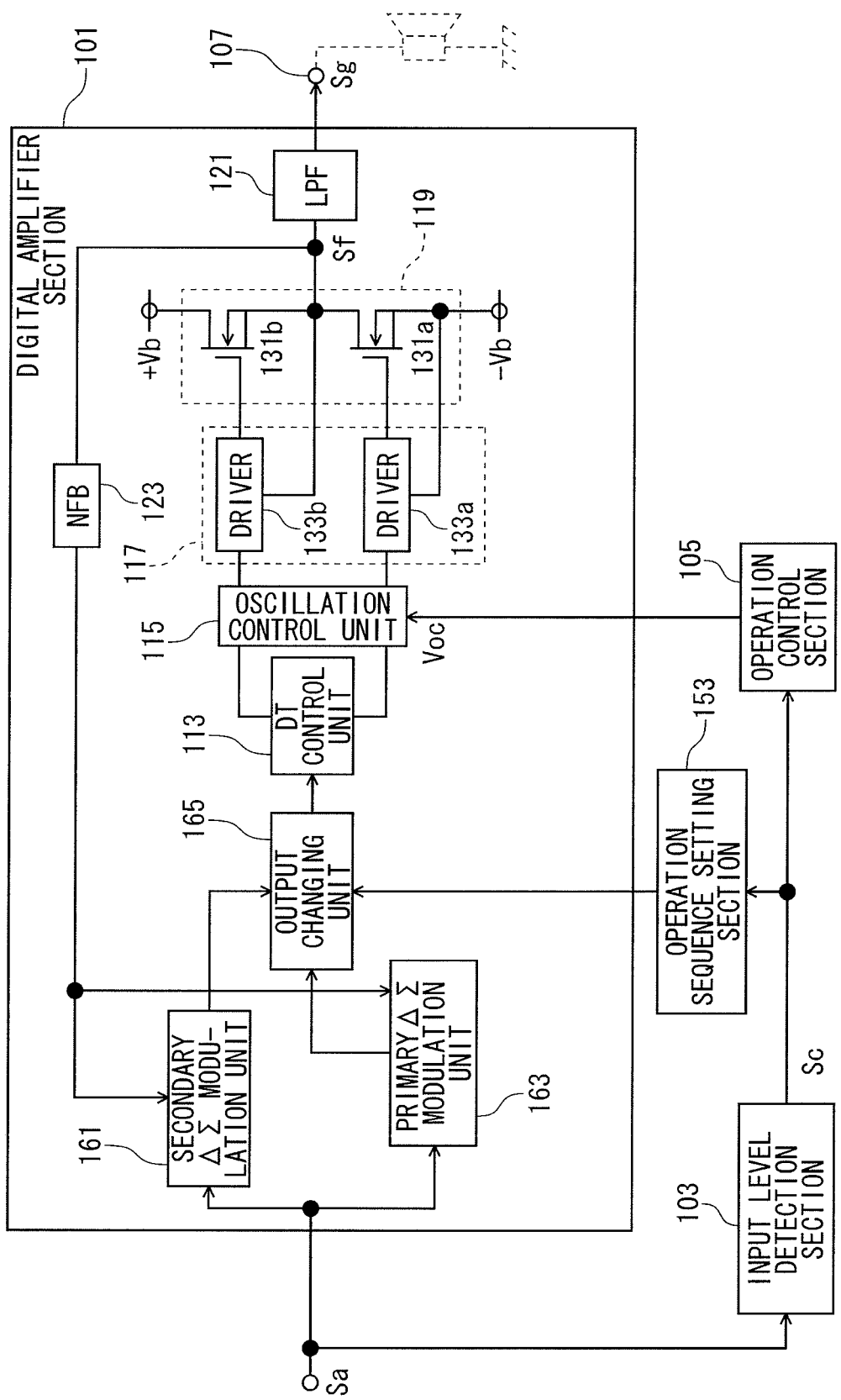
FIG. 19 is a block diagram illustrating a configuration of an output stage of a digital amplifier according to an eleventh embodiment.

FIG. 19 is a block diagram illustrating a configuration of an output stage of a digital amplifier according to the eleventh embodiment. As shown in FIG. 19, the digital amplifier according to the eleventh embodiment further includes an operation sequence setting section 153 in addition to the constituent elements of the digital amplifier according to the first embodiment. In addition, a signal Sc output from the input level detection section 103 is input to the operation sequence setting section 153. The digital amplifier section 101 of the present embodiment includes a secondary $\Delta\Sigma$ modulation unit 161, a primary $\Delta\Sigma$ modulation unit 163, and an output changing unit 165 instead of the modulation unit 111, and the path of the NFB 123 is connected to both the secondary $\Delta\Sigma$ modulation unit 161 and the primary $\Delta\Sigma$ modulation unit 163. The present embodiment is the same as the first embodiment except for them, and the constituent elements common to FIG. 1 are given the same reference numerals in FIG. 19.

A signal Sa is input to the secondary $\Delta\Sigma$ modulation unit 161 and the primary $\Delta\Sigma$ modulation unit 163. Each output signal of the secondary $\Delta\Sigma$ modulation unit 161 and the primary $\Delta\Sigma$ modulation unit 163 is input to the output changing unit 165. The output changing unit 165 changes a signal output to the DT control unit 113 to either an output signal from the secondary $\Delta\Sigma$ modulation unit 161 or an output signal from the primary $\Delta\Sigma$ modulation unit 163.

An output signal Sf of the switching unit 119 is applied to the primary $\Delta\Sigma$ modulation unit 163 and the secondary $\Delta\Sigma$ modulation unit 161 via the NFB 123. The primary $\Delta\Sigma$ modulation unit 163 has a more favorable tracking with respect to the signal Sf than that of the secondary $\Delta\Sigma$ modulation unit 161, and thus the reproducibility immediately after oscillation start of the oscillation control unit 115 is favorable. The reduction in the reproducibility refers to distortion of an audio signal of the digital amplifier due to reduction or the like in a power supply voltage supplied to the digital amplifier. In addition, the secondary $\Delta\Sigma$ modulation unit 161 has a large NFB amount than that of the primary $\Delta\Sigma$ modulation unit 163, and thus the reproducibility thereof is not favorable until sufficient time has elapsed from oscillation of the oscillation control unit 115. The output changing unit 165 outputs a signal from the primary $\Delta\Sigma$ modulation unit 163 for a predetermined time immediately after oscillation of the oscillation control unit 115, and outputs a signal from the secondary $\Delta\Sigma$ modulation unit 161 after the predetermined time has elapsed.

In the present embodiment, an output signal from the primary $\Delta\Sigma$ modulation unit 163 having the favorable reproducibility is used immediately after oscillation start of the oscillation control unit 115, and an output signal from the secondary $\Delta\Sigma$ modulation unit 161 is used after sufficient time has elapsed. For this reason, it is possible to prevent reduction in the reproducibility of the signal immediately after oscillation start of the oscillation control unit 115. In addition, in relation to an order of the $\Delta\Sigma$ modulation units, as long as an order after sufficient time has elapsed is higher than an order immediately after oscillation is started, the same effect can be achieved. Further, as long as the $\Delta\Sigma$ modulation unit is a 1-bit digital pulse converter such as a $\Delta$ modulator, the same effect can be achieved.

In addition, in the above description, the output changing unit 165 changes a signal either a signal from the secondary $\Delta\Sigma$ modulation unit 161 or a signal from the primary $\Delta\Sigma$ modulation unit 163; however, a synthesized signal may be output by gradually changing a ratio of the two signals.

Twelfth Embodiment

Figure 20:
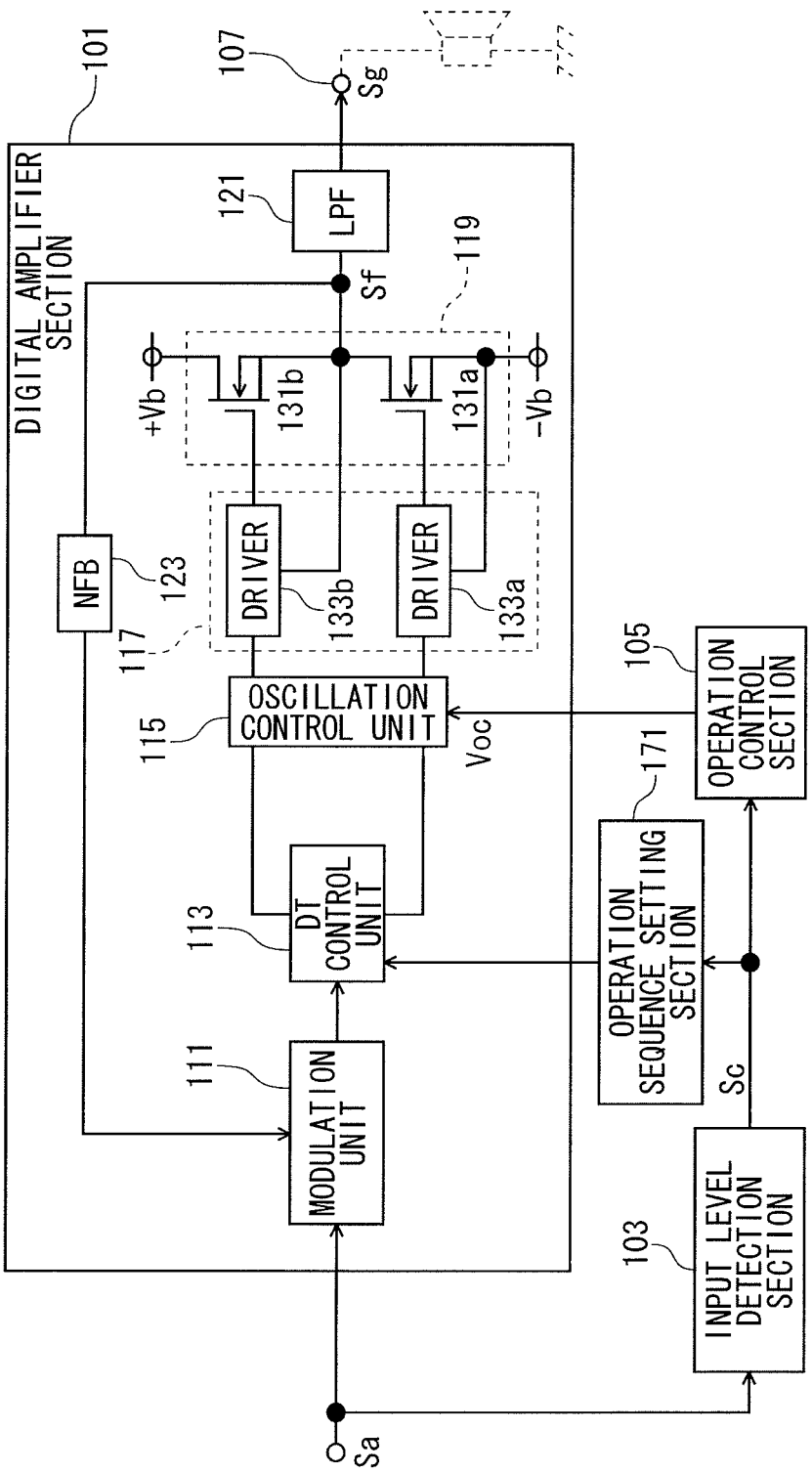
FIG. 20 is a block diagram illustrating a configuration of an output stage of a digital amplifier according to a twelfth embodiment.

FIG. 20 is a block diagram illustrating a configuration of an output stage of a digital amplifier according to the twelfth embodiment. As shown in FIG. 20, the digital amplifier according to the twelfth embodiment further includes an operation sequence setting section 171 in addition to the constituent elements of the digital amplifier according to the first embodiment. In addition, a signal Sc output from the input level detection section 103 is input to the operation sequence setting section 171. The present embodiment is the same as the first embodiment except for them, and the constituent elements common to FIG. 1 are given the same reference numerals in FIG. 20.

The operation sequence setting section 171 controls the DT control unit 113 such that the switching unit 119 performs a switching operation for a dead time which is longer than a typical time for a predetermined time after the switching unit 119 of the digital amplifier section 101 starts the switching operation.

Figure 21:
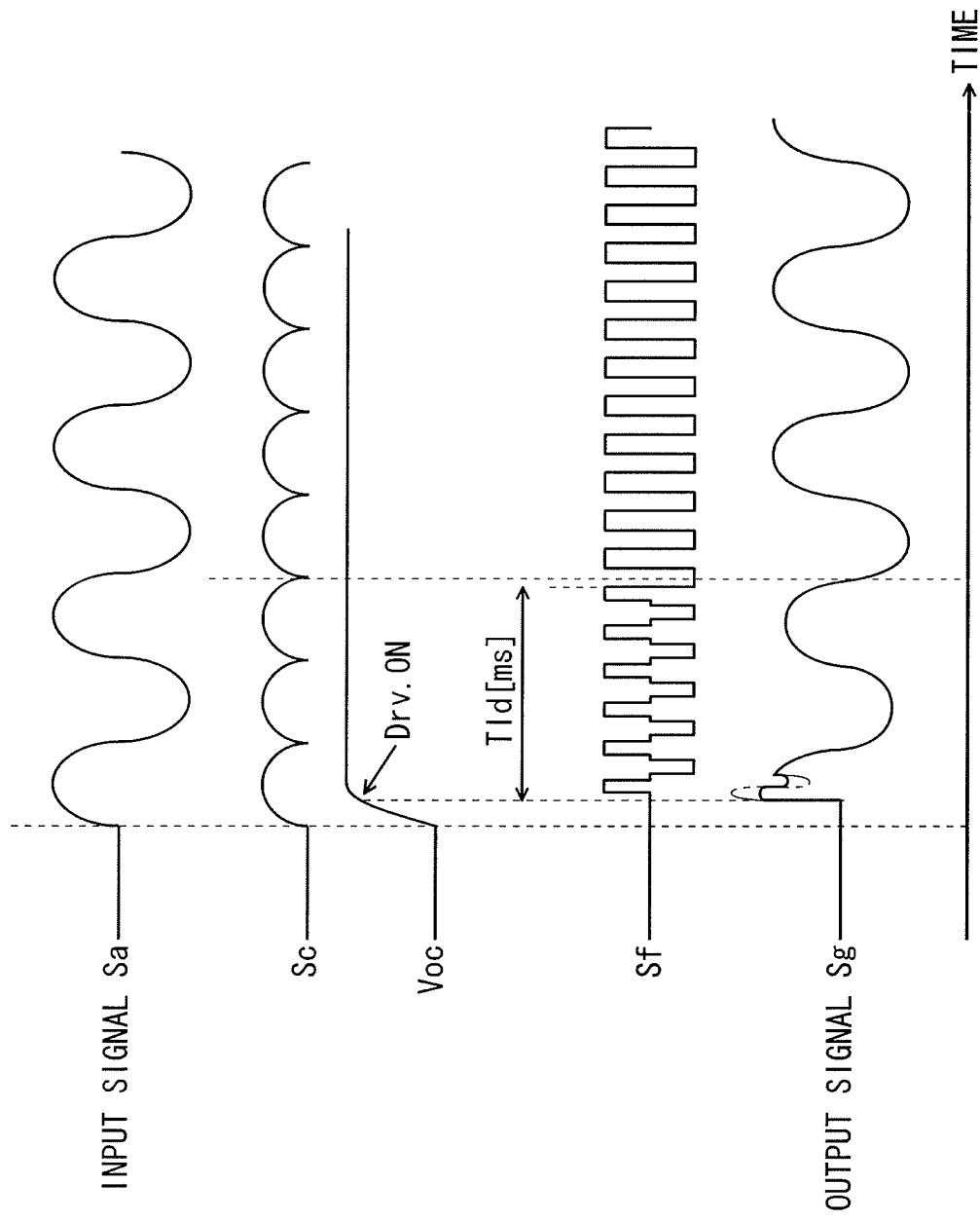
FIG. 21 is a diagram illustrating signal waveforms when a switching operation is started in the digital amplifier according to the twelfth embodiment.

FIG. 21 is a diagram illustrating signal waveforms when a switching operation is started in the digital amplifier according to the twelfth embodiment. A signal Sa shown in FIG. 21 is an input signal of the digital amplifier. A signal Sc is an output signal of the input level detection section 103 and is a signal obtained through full-wave rectification of the input signal Sa. A potential Voc is a potential of an output signal of the operation control section 105 and is a signal obtained by smoothing the signal Sc. A signal Sf is a signal indicating a switching operation performed by the switching unit 119 of the digital amplifier section 101. A signal Sg is a signal obtained by amplifying the input signal Sa and is an output signal of the digital amplifier. The signal Sg is output from the output end 107.

As shown in FIG. 21, when the input signal Sa is changed from an absent state (no signal input state) to an existing state (signal input state), the potential Voc of the output signal of the operation control section 105 rises. Due to the rising of the potential Voc, the oscillation control unit 115 oscillates (Drv. ON), and the path where the input signal Sa is input to the driving unit 117 is closed. The closing of the path indicates that, for example, the driving unit 117 has a configuration in which a photo coupler is embedded, signal transmission is performed by the photo coupler, and an electronic switch such as a transistor controls a current flowing into an input of the photo coupler, and a signal is transmitted by closing the electronic switch. For this reason, the driving unit 117 starts driving control of the switching unit 119 in response to the input signal Sa. At this time, the operation sequence setting section 171 controls the DT control unit 113 so as to perform a switching operation for a dead time which is longer than a typical time for a predetermined time Tld[ms] after the switching unit 119 starts the switching operation.

In addition, if the dead time is made long, a duty ratio of a signal input to each of the drivers 133a and 133b is shortened. If the duty ratio is shortened, an information amount of the input signal Sa in a signal modulated by the modulation unit 111 becomes smaller, thus distortion of the output signal Sg occurs when the signal is demodulated in the LPF 121, thereby deteriorating the reproducibility of the signal. Therefore, the predetermined time Tld when the DT control unit 113 performs control for the dead time longer than a typical time is preferably short.

Noise occurring for the dead time is not output from the output end 107. According to the present embodiment, a turned-on time of the switching elements 131a and 131b is shortened by controlling the dead time immediately after oscillation is started so as to be lengthened, and thereby it is possible to suppress an average current value flowing through the LPF 121 and to reduce pop noise due to a resonance phenomenon of the LPF 121. For example, pop noise indicated by the dashed line in FIG. 21 occurs in a case where the control according to the present embodiment is not performed, but, in the present embodiment, pop noise is small as indicated by the solid line.

Thirteenth Embodiment

Figure 22:
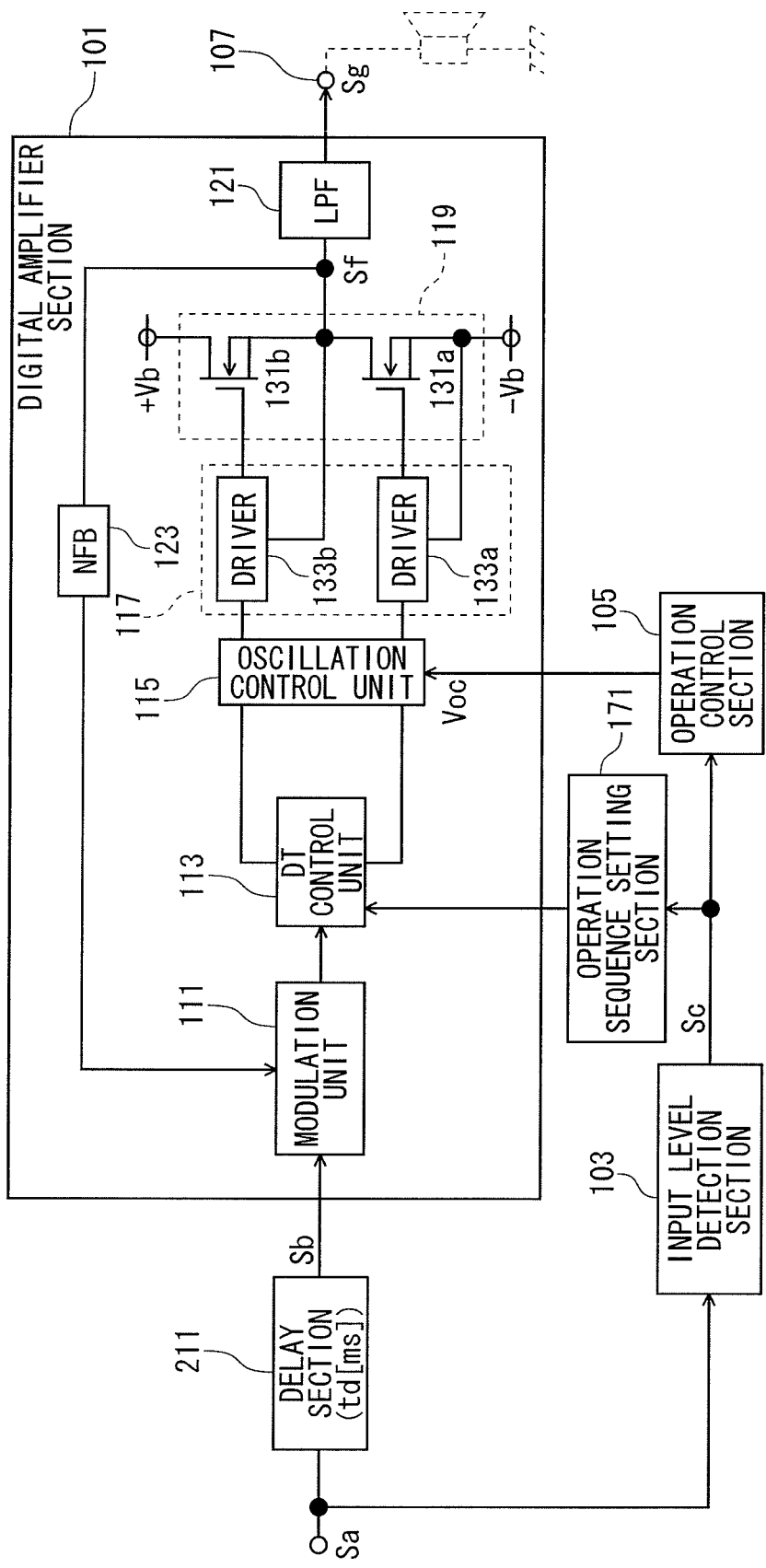
FIG. 22 is a block diagram illustrating a configuration of an output stage of a digital amplifier according to a thirteenth embodiment.

FIG. 22 is a block diagram illustrating a configuration of an output stage of a digital amplifier according to the thirteenth embodiment. As shown in FIG. 22, the digital amplifier according to the thirteenth embodiment further includes an operation sequence setting section 171 in addition to the constituent elements of the digital amplifier according to the second embodiment. In addition, a signal Sc output from the input level detection section 103 is input to the operation sequence setting section 171. The present embodiment is the same as the second embodiment except for them, and the constituent elements common to FIG. 4 are given the same reference numerals in FIG. 22.

The operation sequence setting section 171 controls the DT control unit 113 such that the switching unit 119 performs a switching operation for a dead time which is longer than a typical time for a predetermined time after the switching unit 119 of the digital amplifier section 101 starts the switching operation.

Figure 23:
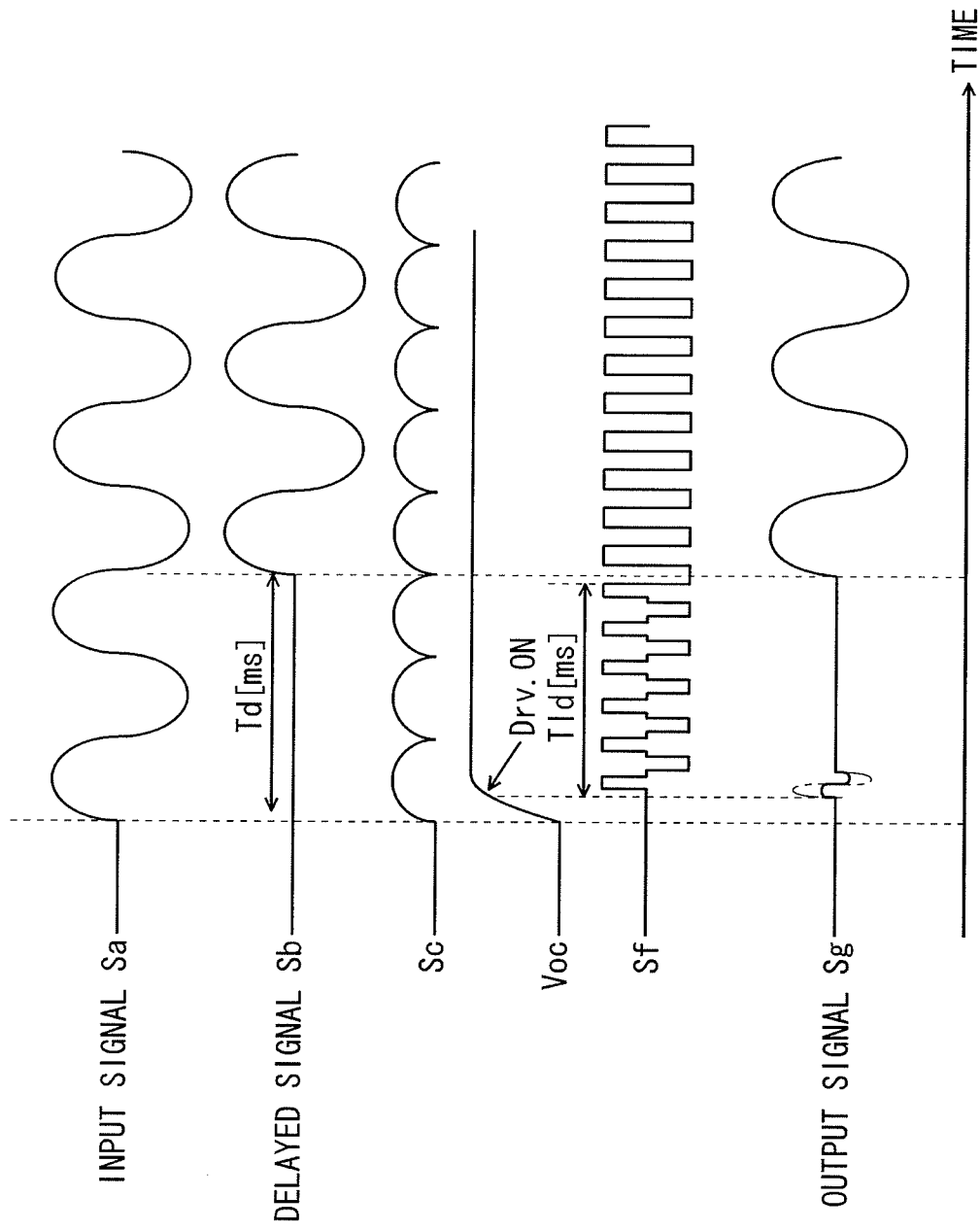
FIG. 23 is a diagram illustrating signal waveforms when a switching operation is started in the digital amplifier according to the thirteenth embodiment.

FIG. 23 is a diagram illustrating signal waveforms when a switching operation is started in the digital amplifier according to the thirteenth embodiment. A signal Sa shown in FIG. 23 is an input signal of the digital amplifier. A signal Sb is an output signal (delayed signal) of the delay section 211 and is input to the digital amplifier section 101. In the example shown in FIG. 23, there is a difference of delay time td[ms] on the time axis between the input signal Sa and the delayed signal Sb. A signal Sc is an output signal of the input level detection section 103 and is a signal obtained through full-wave rectification of the input signal Sa. A potential Voc is a potential of an output signal of the operation control section 105 and is a signal obtained by smoothing the signal Sc. A signal Sf is a signal indicating a switching operation performed by the switching unit 119 of the digital amplifier section 101. A signal Sg is a signal obtained by amplifying the delayed signal Sb and is an output signal of the digital amplifier. The signal Sg is output from the output end 107.

As shown in FIG. 23, when the input signal Sa is changed from an absent state (no signal input state) to an existing state (signal input state), the potential Voc of the output signal of the operation control section 105 rises. Due to the rising of the potential Voc, the oscillation control unit 115 oscillates (Drv. ON), and the path where the delayed signal Sb is input to the driving unit 117 is closed. The closing of the path indicates that, for example, the driving unit 117 has a configuration in which a photo coupler is embedded, signal transmission is performed by the photo coupler, and an electronic switch such as a transistor controls a current flowing into an input of the photo coupler, and a signal is transmitted by closing the electronic switch. For this reason, the driving unit 117 starts driving control of the switching unit 119 in response to the delayed signal Sb. At this time, the operation sequence setting section 171 controls the DT control unit 113 so as to perform a switching operation for a dead time which is longer than a typical time for a predetermined time Tld[ms] after the switching unit 119 starts the switching operation.

In addition, if the dead time is made long, a duty ratio of a signal input to each of the drivers 133a and 133b is shortened. If the duty ratio is shortened, an information amount of the input signal Sa in a signal modulated by the modulation unit 111 becomes smaller, thus distortion of the output signal Sg occurs when the signal is demodulated in the LPF 121, thereby deteriorating the reproducibility of the signal. Therefore, the predetermined time Tld when the DT control unit 113 performs control for the dead time longer than a typical time is preferably short.

Noise occurring for the dead time is not output from the output end 107. According to the present embodiment, a turned-on time of the switching elements 133a and 133b is shortened by controlling the dead time immediately after oscillation is started so as to be lengthened, and thereby it is possible to suppress an average current value flowing through the LPF 121 and to reduce pop noise due to a resonance phenomenon of the LPF 121. For example, pop noise indicated by the dashed line in FIG. 23 occurs in a case where the control according to the present embodiment is not performed, but, in the present embodiment, pop noise is small as indicated by the solid line.

In addition, in the twelfth embodiment, as shown in FIG. 21, sound lack occurs in the output signal Sg. However, in the present embodiment, the signal Sb input to the digital amplifier section 101 is delayed, and thus sound lack does not occur when the digital amplifier section 101 starts a switching operation.

Fourteenth Embodiment

Figure 24:
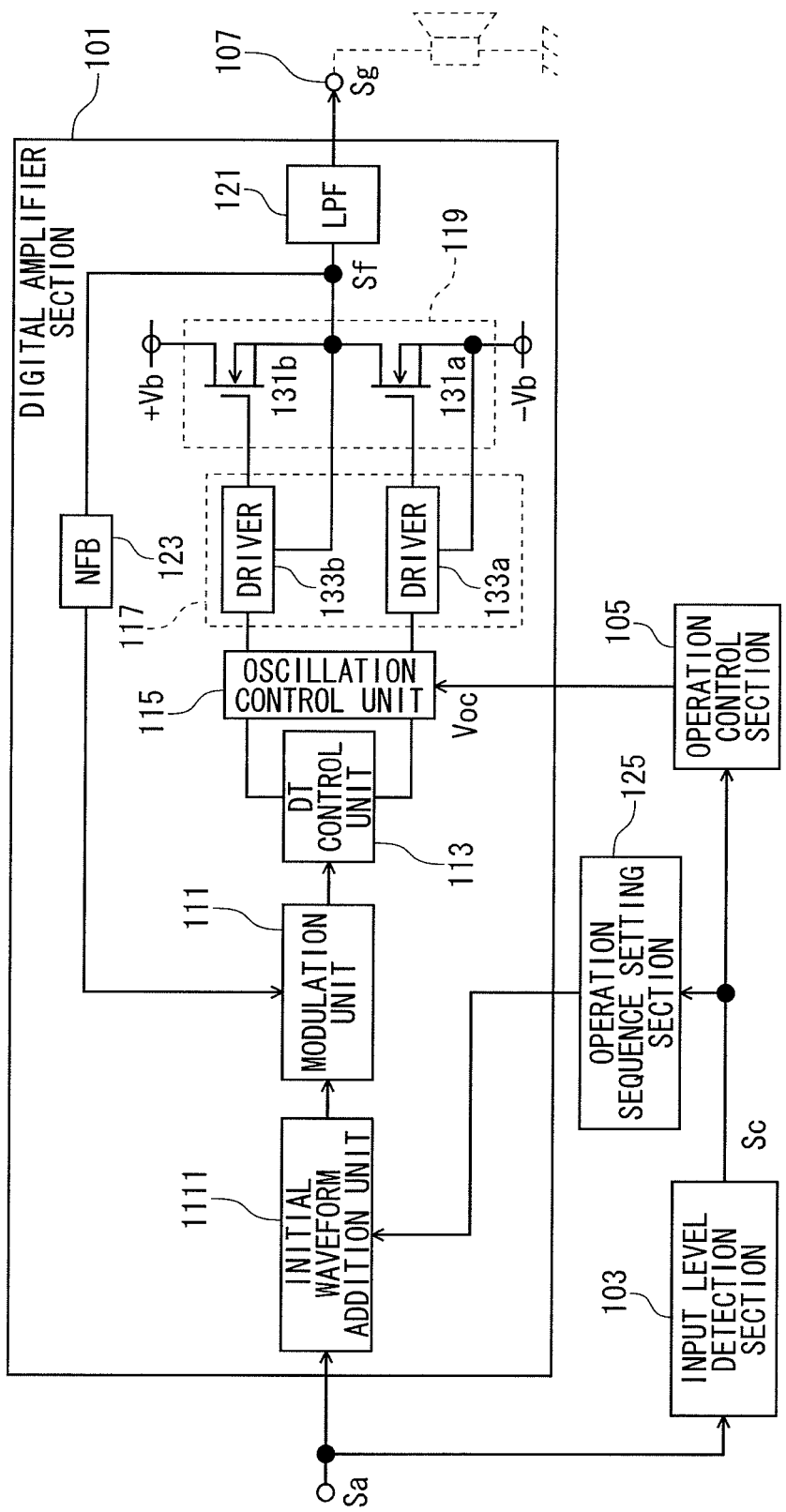
FIG. 24 is a block diagram illustrating a configuration of an output stage of a digital amplifier according to a fourteenth embodiment.

FIG. 24 is a block diagram illustrating a configuration of an output stage of a digital amplifier according to the fourteenth embodiment. As shown in FIG. 24, the digital amplifier according to the fourteenth embodiment further includes an initial waveform addition unit 1111 at the front stage of the modulation unit 111 in the digital amplifier section 101 and an operation sequence setting section 125 which controls the initial waveform addition unit 1111 in addition to the constituent elements of the digital amplifier according to the first embodiment. The present embodiment is the same as the first embodiment except for them, and the constituent elements common to FIG. 1 are given the same reference numerals in FIG. 24.

The operation sequence setting section 125 receives a signal indicating that entrance to a signal input state from a no signal state is detected in the input level detection section 103, and controls the initial waveform addition unit 1111 during a predetermined time period which is enough to suppress pop noise. The initial waveform addition unit 1111 adds a signal which has the same amplitude as and a reverse phase to pop noise occurring when the switching operation is started to a signal input to the digital amplifier section 101. In addition, the initial waveform addition unit 1111 may be provided at the rear stage of the modulation unit 111. In this case, the initial waveform addition unit 1111 adds a signal which has the same amplitude as and a reverse phase to a modulation signal of pop noise to a digital pulse signal output from the modulation unit 111.

According to the present embodiment, even if pop noise occurs when the digital amplifier section 101 starts a switching operation, the pop noise is canceled out by the signal added by the initial waveform addition unit 1111 before being amplified, and thus the pop noise is not output from the output end 107. The pop noise includes, for example, pop noise due to the resonance phenomenon of the LPF 121, pop noise due to a difference between an operation reference point of the modulation unit 111 and an operation reference point of the switching unit 119 described later, and the like.

Fifteenth Embodiment

Figure 25:
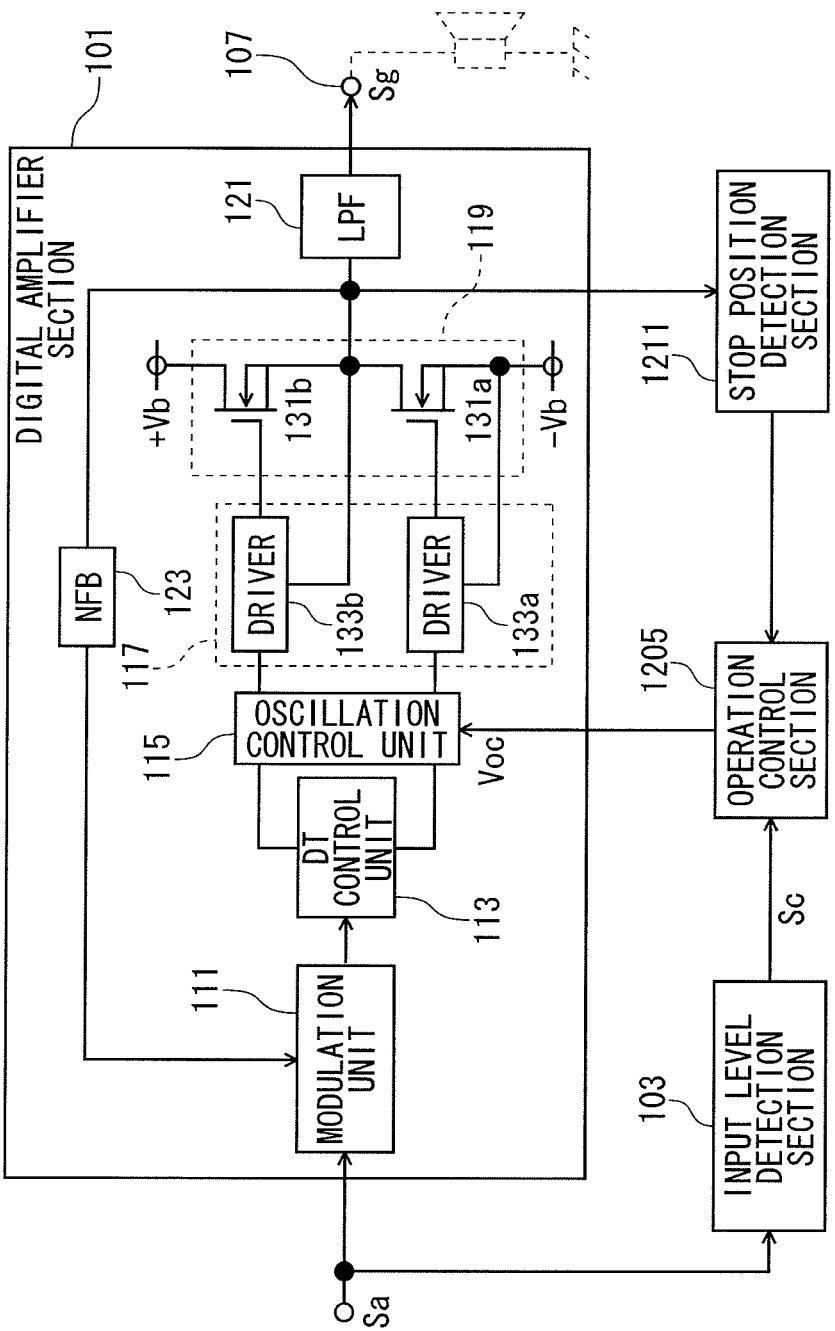
FIG. 25 is a block diagram illustrating a configuration of an output stage of a digital amplifier according to a fifteenth embodiment.

FIG. 25 is a block diagram illustrating a configuration of an output stage of a digital amplifier according to the fifteenth embodiment. As shown in FIG. 25, the digital amplifier according to the fifteenth embodiment further includes a stop position detection section 1211 in addition to the constituent elements of the digital amplifier according to the first embodiment. In addition, an operation control section 1205 of the present embodiment is different from the operation control section 105 of the first embodiment in timing when the digital amplifier section 101 stops a switching operation. The present embodiment is the same as the first embodiment except for them, and the constituent elements common to FIG. 1 are given the same reference numerals in FIG. 25.

Figure 26:
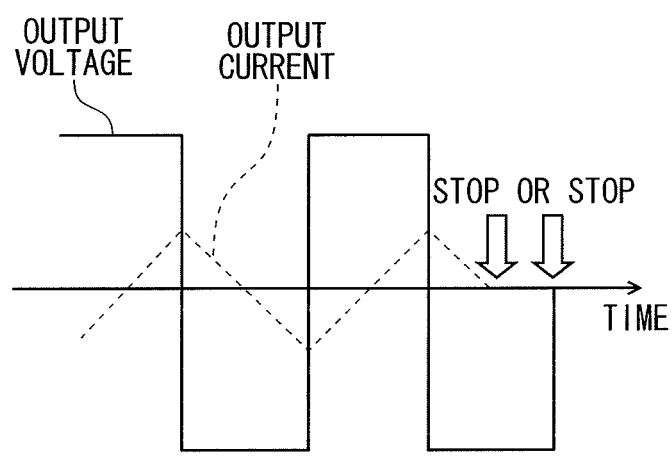
FIG. 26 is a diagram illustrating waveforms of an output voltage and an output current of a switching unit of the digital amplifier section.

When the digital amplifier is changed from a signal input state to a no signal input state, as shown in FIG. 26, pop noise occurs unless the switching operation is stopped at a position where a value of an output voltage or an output current of the switching unit 119 is 0. The stop position detection section 1211 detects the position where a value of an output voltage or an output current of the switching unit 119 is 0, sends a signal indicating the detection result to the operation control section 1205, and controls an oscillation operation of the oscillation control unit 115. Thereby, the switching operation can be stopped at the position where a value of the output voltage or the output current is 0. As detection means of the output current, for example, a low resistor is inserted into a current path, and a value converted into a voltage value is detected.

In addition, although an output position by the LPF 121 is shifted when the output voltage is 0 or when the output current is 0, both of the two are 0 in terms of power, and a position where a value of the output voltage or the output current is 0 may be called a position where power is 0.

According to the present embodiment, when the digital amplifier is changed from a signal input state to a no signal input state, a switching operation is stopped at a position where a value of an output voltage or an output current of the switching unit 119 is 0 (a position where power is 0). For this reason, it is possible to reduce pop noise when the digital amplifier enters a no signal input state.

Sixteenth Embodiment

Figure 27:
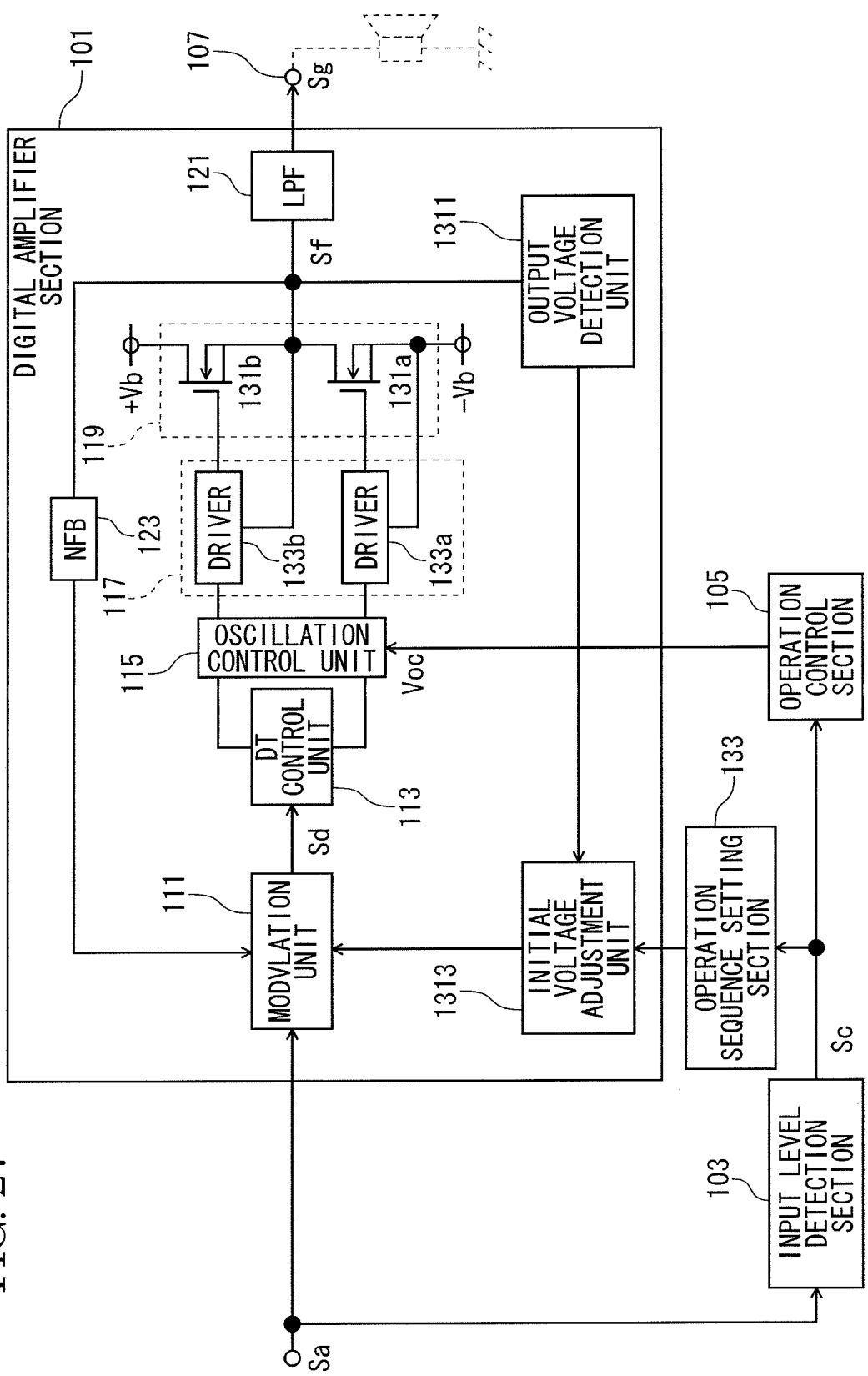
FIG. 27 is a block diagram illustrating a configuration of an output stage of a digital amplifier according to a sixteenth embodiment.

FIG. 27 is a block diagram illustrating a configuration of an output stage of a digital amplifier according to the sixteenth embodiment. As shown in FIG. 27, the digital amplifier according to the sixteenth embodiment further includes an operation sequence setting section 133 in addition to the constituent elements of the digital amplifier according to the first embodiment, and has an output voltage detection unit 1311 and an initial voltage adjustment unit 1313 in the digital amplifier section 101. The present embodiment is the same as the first embodiment except for them, and the constituent elements common to FIG. 1 are given the same reference numerals in FIG. 27.

On the input side of the modulation unit 111 forming the digital amplifier, for example, an integrator (not shown) such as a high-speed OP amplifier IC is configured. The integrator is driven with a single power supply such as a power supply voltage being +5[V] or the like. On the other hand, the switching unit 119 is driven with both power supplies such as power supply voltages being ±20[V]. Both of an input signal and an output signal are required to be alternating currents such that the digital amplifier of the present embodiment has a fundamental power-amplifier function. Therefore, the integrator is made to be driven using +2.5[V] which is a half of +5[V] as an operation reference point, and the switching unit 119 is made to be driven using 0[V] which is an intermediate value of ±20[V] as an operation reference point. As such, since there are margins in the operation reference point on the input side of the digital amplifier and the operation reference point on the output side thereof, it is necessary to take a great dynamic range. For this reason, a level shift circuit such as a photo coupler is embedded in the driving unit 117 so as to match an operation reference point.

An output voltage of the digital amplifier in a no signal input state is almost 0[V] since the switching unit 119 has high impedance and impedance of the load is 4 to 8[Ω]. As described above, the integrator of the modulation unit 111 is driven at an operation reference point of +2.5[V] by a bias voltage of an inverting terminal of the OP amplifier forming the integrator. However, an input voltage of the integrator in a no signal input state is 0[V], and an output voltage is +2.5[V] which is the operation reference point. In other words, the integrator in a no signal input state stands by in a state where +2.5[V] is applied to a capacitor forming the integrator.

The output voltage detection unit 1311 detects a voltage on the output side of the switching unit 119, and sends a signal indicating the detection result to the initial voltage adjustment unit 1313. The initial voltage adjustment unit 1313 adjusts a voltage on the output side of the modulation unit 111 so as to be the same as a voltage indicated by the signal sent from the output voltage detection unit 1311. In other words, the initial voltage adjustment unit 1313 applies a predetermined bias voltage to the integrator of the modulation unit 111. When a signal is input to the digital amplifier, the operation sequence setting section 133 drives the initial voltage adjustment unit 1313 for a predetermined time immediately after the signal is input.

Figure 28A:
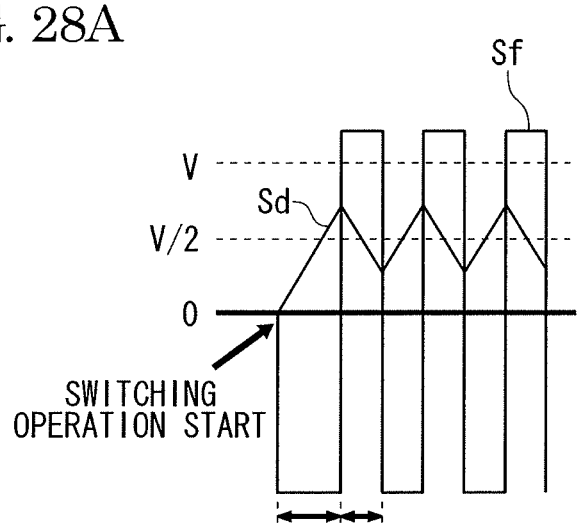
FIG. 28 is a diagram illustrating a waveform of an output voltage Sd of the modulation unit and a waveform of an output voltage Sf of the switching unit when the digital amplifier section starts a switching operation, wherein (a) shows a waveform in a case where a bias voltage is not applied to the modulation unit, and (b) shows a waveform in a case where the bias voltage is applied to the modulation unit.
Figure 28B:
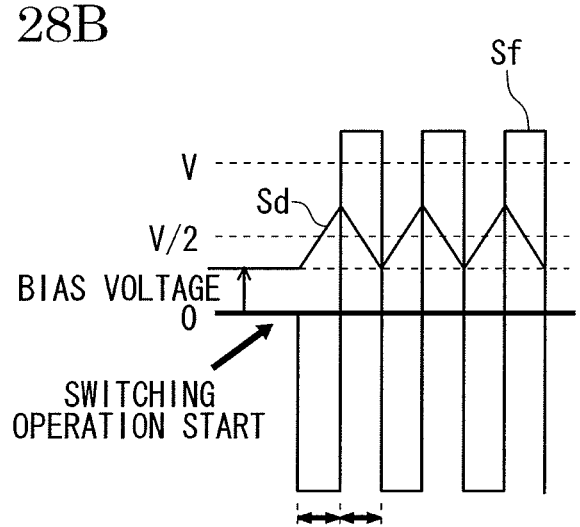
Figure 29:
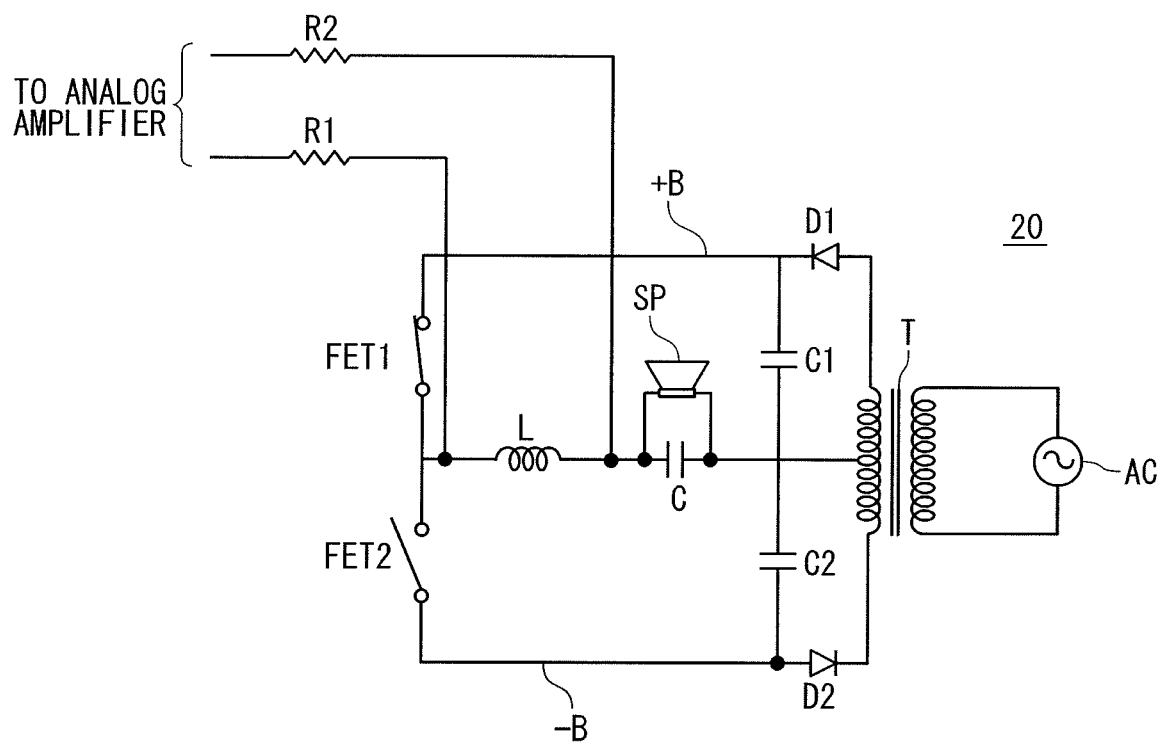
FIG. 29 is a diagram illustrating a portion of the switching amplifier shown in FIG. 7 of PTL 1.
Figure 30:
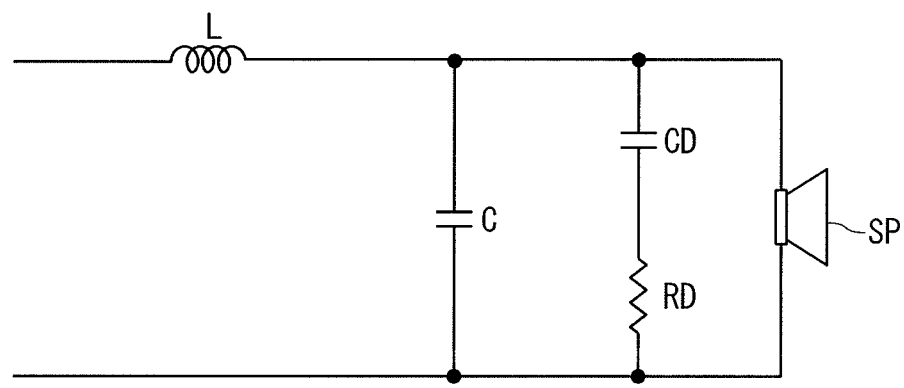
FIG. 30 is a diagram illustrating an example of the frequency characteristics of the low-pass filter.
Figure 31:
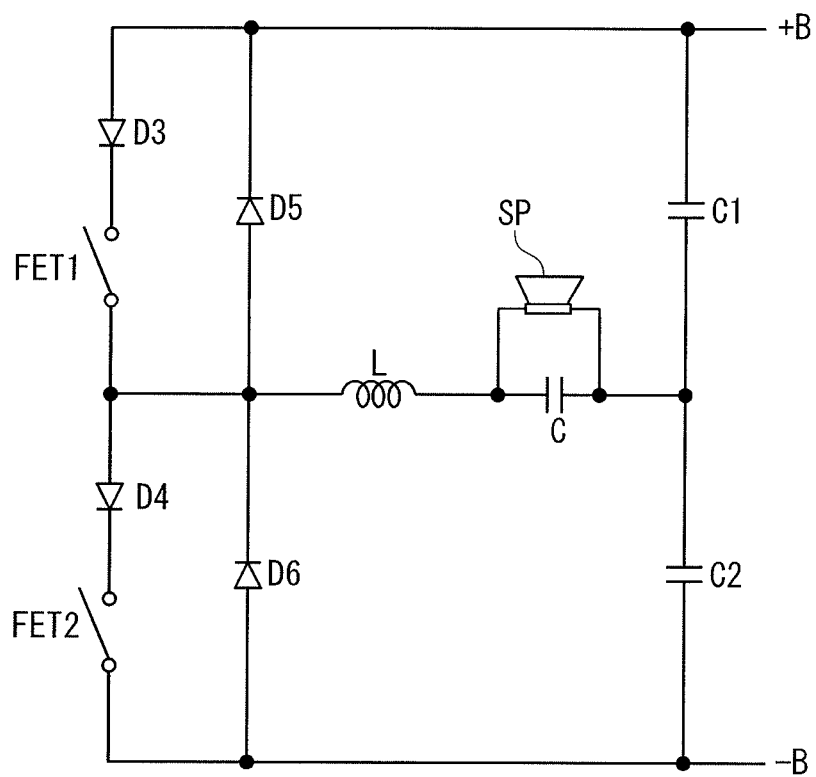
FIG. 31 is a diagram illustrating a configuration for removing harmful effects of a through current caused by an embedded diode of the switching element.
Figure 32:
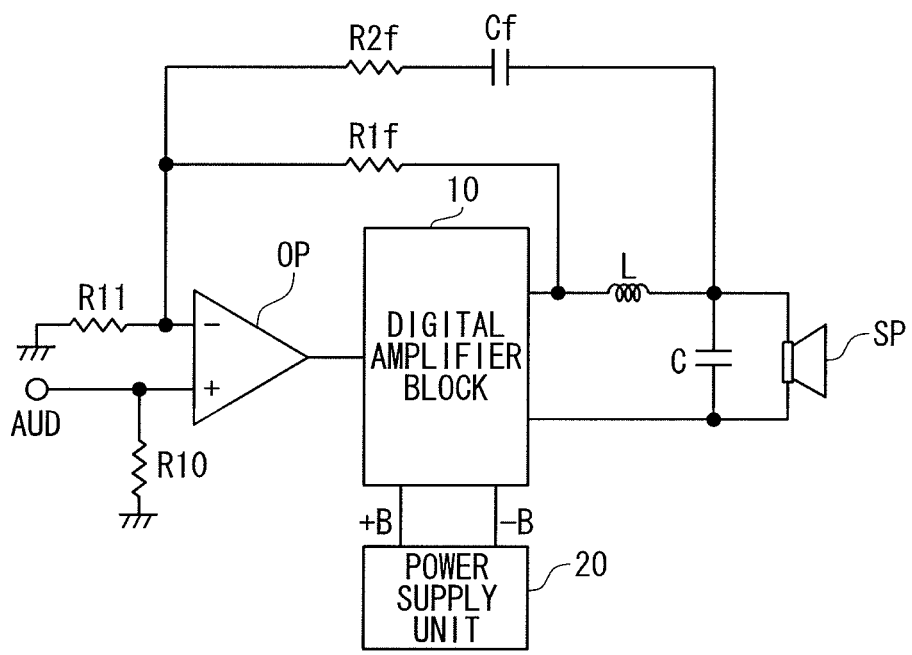
FIG. 32 is a diagram illustrating an entire configuration of the digital power amplifier shown in FIG. 1 of PTL 1.
Figure 33:
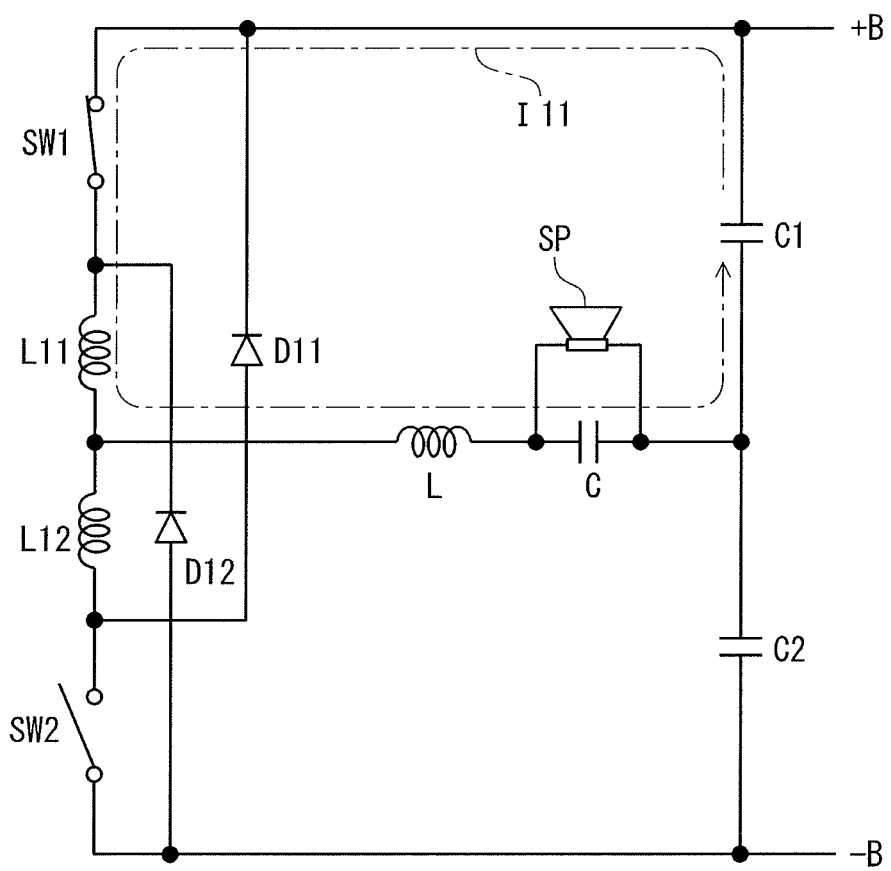
FIG. 33 is a diagram illustrating a power supply current path in a state where only one switching element is turned on in a switching unit forming a portion of the digital amplifier block.
Figure 34:
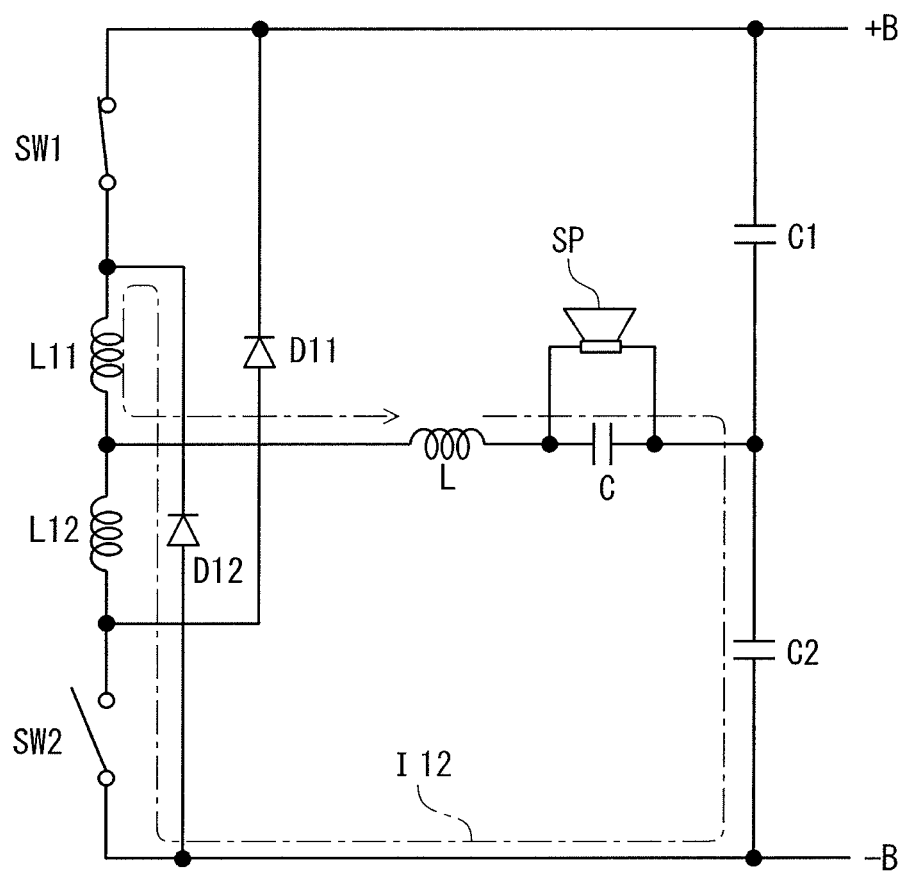
FIG. 34 is a diagram illustrating a current path due to a counter electromotive force of a low-pass filter coil immediately after the turned-on switching element is turned off.

FIG. 28 is a diagram illustrating a waveform of an output voltage Sd of the modulation unit and a waveform of an output voltage Sf of the switching unit when the digital amplifier section starts a switching operation, wherein (a) shows a waveform in a case where a bias voltage is not applied to the modulation unit, and (b) shows a waveform in a case where the bias voltage is applied to the modulation unit. As shown in FIG. 28(*a*), in a case where the configuration according to the sixteenth embodiment is not employed, when changing from a no signal input state to a signal input state is performed and thus a switching operation is started, a potential difference of +2.5[V] in the integrator of the modulation unit 111 has influence on a switching period, and thereby a duty ratio of the output voltage Sf of the switching unit 119 does not become 50%. As a result, pop noise occurs.

On the other hand, in a state where a predetermined bias voltage is applied to the integrator of the modulation unit 111 by the initial voltage adjustment unit 1313, even if changing from a no signal input state to a signal input state is performed and thus a switching operation is started, a duty ratio of the output voltage Sf of the switching unit 119 becomes 50%, as shown in FIG. 28(*b*). For this reason, pop noise does not occur.

According to the present embodiment, when a signal is input to the digital amplifier, since a bias voltage is applied to the integrator of the modulation unit 111 such that a voltage on the output side of the modulation unit 111 conforms to a voltage on the output side of the switching unit 119, pop noise does not occur when the digital amplifier section 101 starts a switching operation.

In addition, although the switching unit 119 included in the digital amplifier section 101 according to the above-described embodiments has two switching elements, the number of switching elements may be one or four. In addition, the number of drivers included in the driving unit 117 corresponds to the number of switching elements included in the switching unit 119.

Further, at least one of the first to fourth embodiments may be combined with at least one of the fifth to sixteenth embodiments.

Although the present invention has been described in detail with reference to the specific embodiments, it is apparent to a person skilled in the art that various alternations or modifications may be performed without departing from the spirit and the scope of the present invention.

This application is based on Japanese Patent Application No. 2010-054643 filed Mar. 11, 2010, the entire contents of which are incorporated herein by reference.

INDUSTRIAL APPLICABILITY

The present invention is useful as a digital amplifier or the like which does not perform a switching operation when no signal is input.

REFERENCE SIGNS LIST

101 DIGITAL AMPLIFIER SECTION
103 AND 403 INPUT LEVEL DETECTION SECTION (INPUT SIGNAL DETECTION UNIT)
105, 305, AND 1205 OPERATION CONTROL SECTION (FIRST CONTROL UNIT)
107 OUTPUT END
111 MODULATION UNIT (FIRST MODULATION UNIT)
113 DEAD TIME CONTROL UNIT (DT CONTROL UNIT)
115 OSCILLATION CONTROL UNIT
117 DRIVING UNIT
119 SWITCHING UNIT
121 LPF
123 NFB (FEEDBACK UNIT)
125, 127, 133, 153, AND 171 OPERATION SEQUENCE SETTING SECTION (THIRD CONTROL UNIT, FOURTH CONTROL UNIT, DEAD TIME SETTING UNIT, SECOND CONTROL UNIT, FIFTH CONTROL UNIT)
131a AND 131b SWITCHING ELEMENT
133a AND 133b DRIVER
211 DELAY SECTION
311 SWITCH (SWITCH UNIT)
411 OR CIRCUIT (LOGICAL OPERATION UNIT)
511, 613, AND 811 GAIN CORRECTION UNIT (FIRST GAIN CORRECTION UNIT)
611 AND 911 POWER SUPPLY VOLTAGE DETECTION UNIT
151 NFB AMOUNT CONTROL SECTION (FEEDBACK AMOUNT CHANGING UNIT)
711 AND 165 OUTPUT CHANGING UNIT
161 SECONDARY ΔΣ MODULATION UNIT (HIGH-ORDER MODULATION UNIT)
163 PRIMARY ΔΣ MODULATION UNIT (LOW-ORDER MODULATION UNIT)
713 NON-FEEDBACK MODULATION UNIT (SECOND MODULATION UNIT)
1111 INITIAL WAVEFORM ADDITION UNIT (INPUT SIGNAL CORRECTION UNIT)
1211 STOP POSITION DETECTION SECTION (SIGNAL DETECTION UNIT)
1311 OUTPUT VOLTAGE DETECTION UNIT
1313 INITIAL VOLTAGE ADJUSTMENT UNIT

The invention claimed is:

1. A digital amplifier which amplifies a signal, comprising:
a switching unit that amplifies a signal input to the digital amplifier by performing a switching operation;
a driving unit that turns the switching unit on and off;
an input signal detection unit that detects whether or not there is an input signal to the digital amplifier;
a first control unit that performs control such that the switching unit starts a switching operation by starting driving of the driving unit, when the digital amplifier is changed from a no signal input state to a signal input state and the input signal detection unit detects an input signal to the digital amplifier, and performs control such that the switching unit stops the switching operation by stopping the driving of the driving unit, when the digital amplifier is changed from a signal input state to a no signal input state, and the input signal detection unit does not detect an input signal to the digital amplifier;
modulation units that perform pulse modulation for an input signal to the digital amplifier;
a feedback unit that feeds back an output signal of the switching unit to the modulation unit; and
a feedback aspect changing unit that changes a feedback aspect of the feedback unit according to a detection result of the input signal detection unit.

2. The digital amplifier according to claim 1, wherein an order of the feedback unit is variable, and
wherein the feedback aspect changing unit performs control so as to decrease the order of the feedback unit to a first order for a predetermined time immediately after the input signal detection unit detects an input signal to the digital amplifier.

3. The digital amplifier according to claim 1, wherein the modulation units are a plurality of kinds of modulation units that are provided in parallel to the input signal, and include a first modulation unit that performs pulse modulation for an input signal to the digital amplifier in response to a feedback signal from the feedback unit, and a second modulation unit that performs the pulse modulation for the input signal to the digital amplifier without regard to the feedback signal from the feedback unit,
wherein the feedback aspect changing unit includes an output changing unit that outputs at least one of output signals of the plurality of kinds of modulation units to the driving unit, and a second control unit that controls the output changing unit so as to output at least one of output signals of the plurality of kinds of modulation units, and
wherein the second control unit controls the output changing unit such that an output signal of the second modulation unit is output for a predetermined time immediately after the input signal detection unit detects an input signal to the digital amplifier, and, thereafter, an output signal of the first modulation unit is output.

4. The digital amplifier according to claim 1, wherein the modulation units are a plurality of kinds of modulation units that are provided in parallel to the input signal, and include a high-order modulation unit that performs pulse modulation for an input signal to the digital amplifier in response to a feedback signal from the feedback unit, and a low-order modulation unit that performs the pulse modulation for the input signal to the digital amplifier in response to the feedback signal from the feedback unit,
- wherein the feedback aspect changing unit includes an output changing unit that outputs at least one of output signals of the plurality of kinds of modulation units to the driving unit, and a second control unit that controls the output changing unit so as to output at least one of output signals of the plurality of kinds of modulation units, and
- wherein the second control unit controls the output changing unit such that an output signal of the low-order modulation unit is output for a predetermined time immediately after the input signal detection unit detects an input signal to the digital amplifier, and, thereafter, an output signal of the high-order modulation unit is output.

* * * * *